US010666030B2

(12) United States Patent
Dinh et al.

(10) Patent No.: US 10,666,030 B2
(45) Date of Patent: May 26, 2020

(54) EXPANDABLE WHILE-IN-USE ELECTRICAL BOX COVER

(71) Applicant: Thomas & Betts International LLC, Wilmington, DE (US)

(72) Inventors: Cong Thanh Dinh, Collierville, TN (US); Michael O'Neil, Germantown, TN (US)

(73) Assignee: Thomas & Betts International LLC, Wilmington, DE (US)

( * ) Notice: Subject to any disclaimer, the term of this patent is extended or adjusted under 35 U.S.C. 154(b) by 204 days.

(21) Appl. No.: 15/673,506

(22) Filed: Aug. 10, 2017

(65) Prior Publication Data

US 2018/0048132 A1 Feb. 15, 2018

Related U.S. Application Data

(60) Provisional application No. 62/373,181, filed on Aug. 10, 2016.

(51) Int. Cl.
| | |
|---|---|
| *H02G 3/08* | (2006.01) |
| *H02G 3/14* | (2006.01) |
| *H02G 3/18* | (2006.01) |
| *H05K 5/00* | (2006.01) |
| *H05K 5/02* | (2006.01) |
| *H05K 5/03* | (2006.01) |
| *H01R 13/52* | (2006.01) |

(52) U.S. Cl.
CPC ............ *H02G 3/081* (2013.01); *H02G 3/088* (2013.01); *H02G 3/14* (2013.01); *H02G 3/18* (2013.01); *H05K 5/0013* (2013.01); *H05K 5/0221* (2013.01); *H05K 5/0226* (2013.01); *H05K 5/03* (2013.01); *H01R 13/5213* (2013.01)

(58) Field of Classification Search
CPC ................................. H02G 3/081; H02G 3/14
USPC ..................................................... 220/3.2, 3.7
See application file for complete search history.

(56) References Cited

U.S. PATENT DOCUMENTS

| | | | | |
|---|---|---|---|---|
| 1,481,415 A | * | 1/1924 | Casper ................... | G01R 11/04 220/4.02 |
| 2,458,153 A | * | 1/1949 | Festge ................ | H01R 13/4538 439/140 |

(Continued)

OTHER PUBLICATIONS

Canadian Intellectual Property Office, Office Action issued in corresponding Canadian application No. 2,976,073, dated Mar. 19, 2018, 4 pp.

*Primary Examiner* — Jeffrey R Allen
(74) *Attorney, Agent, or Firm* — Taft Stettinius & Hollister LLP; J. Bruce Schelkopf

(57) ABSTRACT

An electrical box cover including a base having a back wall perimetrically bounded by an upwardly extending side wall. The back wall having an opening for receiving an electrical device. A lid pivotally connected to the base. The lid having a lid plate with an opening that is defined by a collar. A housing having a front wall and a plurality of contiguous side walls extending therefrom to a distal edge to define a housing interior. The housing has a flange extending from the side walls and is slidably disposed in the lid opening and moveable between a retracted and extended position with respect to the collar. A plurality of lugs can extend inwardly from the collar and the flange engages the lugs when the housing is in the extended position.

19 Claims, 25 Drawing Sheets

(56) References Cited

U.S. PATENT DOCUMENTS

| | | | | |
|---|---|---|---|---|
| 3,514,008 | A * | 5/1970 | Dorn | A61J 7/0046 220/8 |
| 7,179,996 | B1 * | 2/2007 | Britt | H01R 13/447 174/66 |
| 7,259,328 | B1 * | 8/2007 | Gretz | H02G 3/086 174/50 |
| 7,462,777 | B2 * | 12/2008 | Dinh | H01R 13/5213 174/58 |
| 8,017,865 | B1 * | 9/2011 | Baldwin | H02G 3/14 174/53 |
| 8,899,432 | B2 * | 12/2014 | Jolly | H02G 3/14 220/3.8 |

* cited by examiner

EXPANDABLE WHILE-IN-USE ELECTRICAL BOX COVER

This application claims the benefit of priority to U.S. Provisional Patent Application Ser. No. 62/373,181, filed on Aug. 10, 2016, the entire content of which is incorporated by reference herein.

FIELD OF THE INVENTION

The present disclosure relates to an electrical box cover. More particularly, the present invention is directed to a while-in-use electrical box cover having a variable depth.

BACKGROUND OF THE INVENTION

Electrical boxes provide a housing for electrical components, such as outlets and switches, when installed in the walls, ceilings or floors of buildings. Electrical boxes are typically secured to a support structure such as a wall stud and aligned with an opening in a covering material, such as wall board or siding. Boxes may be employed to house electrical components both indoors and outdoors.

Outdoor applications typically utilize electrical boxes that can resist contamination, such as water and dirt, created by exposure to the elements. Indoor applications, such as in a bathroom or industrial setting, may also subject an installed electrical component to contamination from cleaning fluid or other debris. Typical outlet boxes include a housing which holds the electrical component and a bracket having a flange which abuts the front face of the wall. In order to satisfy the requirements of such applications, electrical boxes also typically include a cover to shield the electrical components from contamination. Electrical box covers of the prior art may include openings therein to permit cords to extend therethrough, thereby allowing an electrical outlet to be used even when the cover is closed.

Such while-in-use covers are well known in the industry and are used to provide an enclosed housing for electrical devices, such as electrical receptacles, ground fault circuit interrupters (GFCI), pushbuttons and switches. While-in-use covers can be installed over electrical devices without having to turn off the device and disconnect the wiring. This makes while-in-use covers convenient and easy to use. The purpose of the cover is primarily to prevent dust, water, and other foreign materials from entering the receptacle. It is of particular importance to prevent rain water from entering the electrical device in order to reduce the risk of short circuits, fire and damage to the device and the electrical system connected to it.

The while-in-use covers currently being used provide protection against water and dust but they are not versatile enough to be used for a broad range of applications. These while-in-use covers are often too small to house large plugs, for example, when a power cord that is plugged into a receptacle requires a converter plug. Moreover, the existing while-in-use covers provide fixed size enclosures and one cover cannot be used for a variety of applications. Another concern is that electrical wire can have different gauges (i.e., diameters), with larger gauge wire having a larger bend radius than smaller gauge wire. Accordingly, it is desirable to provide a while-in-use cover that is adjustable and can expand to accommodate a variety of different size plugs and wire bend radii. It is also desirable to provide a while-in-use cover that can collapse or decrease in size when not in use or when its full extension is not required.

Accordingly, it would be desirable to provide an electrical box which is useable both indoors and outdoors and can be properly secured and provides a degree of adjustability to accommodate the position of the box and the thickness of the covering material.

SUMMARY OF THE INVENTION

A first embodiment of the present invention is an electrical box cover that comprising, consisting of or consisting essentially of a base, a lid and a housing. The base comprises, consists of or consists essentially of a back wall perimetrically bounded by an upwardly extending continuous side wall formed from a plurality of side wall segments. The back wall can have an opening for receiving an electrical device. The base can have first and second hinge members secured to adjacent side wall segments. The base can further comprise, consist of or consist essentially of an adapter plate disposed on the back wall and the back wall can include a plurality of lugs extending upwardly therefrom. The lugs engaging the adapter plate and, when the housing is in the retracted position, the housing engages the adapter plate.

The lid comprises, consists of or consists essentially of a front plate with an opening defined by a collar. The lid can have an exterior side and an interior side and can be pivotably connected to the base. The lid can further comprise, consist of or consist essentially of at least two hinge elements extending from the interior side of the lid plate. Two of the hinge elements can be selectively engaged with one of the first or second hinge members of the base in order to permit the lid to be pivotably attached to separate locations on the base. The lid can further comprise, consist of or consist essentially of a front plate perimetrically bound by an extension projecting orthogonally from the front plate. The housing distal edge and the housing flange extend beyond the lid extension.

The housing comprises, consists of or consists essentially of a front wall and a perimetrical side wall extending from the front wall to a distal edge to define a housing interior and an exterior. A flange offset from the distal edge extends from the perimetrical side wall on the exterior of the housing. The housing is slidably inserted in the collar from the interior side of the lid and is moveable between a retracted and an extended position with respect to the collar. The flange engages the collar when the housing is in the extended position. A plurality of lugs can extend into the interior of the housing from the collar. The housing can have a tab extending outwardly therefrom engageable with the collar to limit travel of the housing in a retracted direction.

The lid can further comprise, consist of or consist essentially of a latch extending therefrom and the base can further comprise, consist of or consist essentially of a catch cooperating with the latch to secure the lid in the closed position. The cover has a depth dimension extending between the base back wall to the housing front wall, the depth being adjustable upon movement of the housing. The travel of the distal edge of the housing is limited to travel within the base when the lid is in the closed position.

A second embodiment of the present invention is an electrical box cover, the cover comprising, consisting of or consisting essentially of a base, a lid and a housing. The base comprises, consists of or consists essentially of a back wall perimetrically bounded by an upwardly extending side wall. The back wall can have an opening for receiving an electrical device. The base can further comprise, consist of or consist essentially of an adapter plate disposed in the base back wall opening and configured to generally receive a plurality of electrical devices. The adapter plate has an opening specifically designed to receive an electrical device with a particular configuration.

The lid comprises, consists of or consists essentially of a lid plate having an opening and is pivotally connected to the base at first and second positions. The opening is defined by a collar extending above and below the lid plate. A plurality of lugs can project inwardly from the collar. When the housing is in the extended position, the flange is spaced from an edge of the collar by the lugs.

The housing comprises, consists of or consists essentially of a front wall and a plurality of contiguous side walls extending therefrom that define a housing interior and exterior. The side walls terminate at a distal edge and have a flange offset from the distal edge. The flange extends outwardly from the exterior of the side walls. The housing is slidably disposed within the lid opening and moveable between a retracted and extended position with respect to the collar. The flange engages the collar when the housing is in the extended position. The housing can further comprise, consist of or consist essentially of a stop disposed on one of the plurality of sidewalls to limit travel of the housing toward the retracted position.

BRIEF DESCRIPTION OF THE DRAWINGS

FIGS. 13A-17 are various views of an alternative embodiment of an electrical box cover with an adapter plate.

DETAILED DESCRIPTION

With reference to FIGS. 1-5, an electrical box cover is shown. The cover 10 is attachable to an electrical box 11 containing one or more electrical devices 13 such as an outlet or switch.

Figure 1:
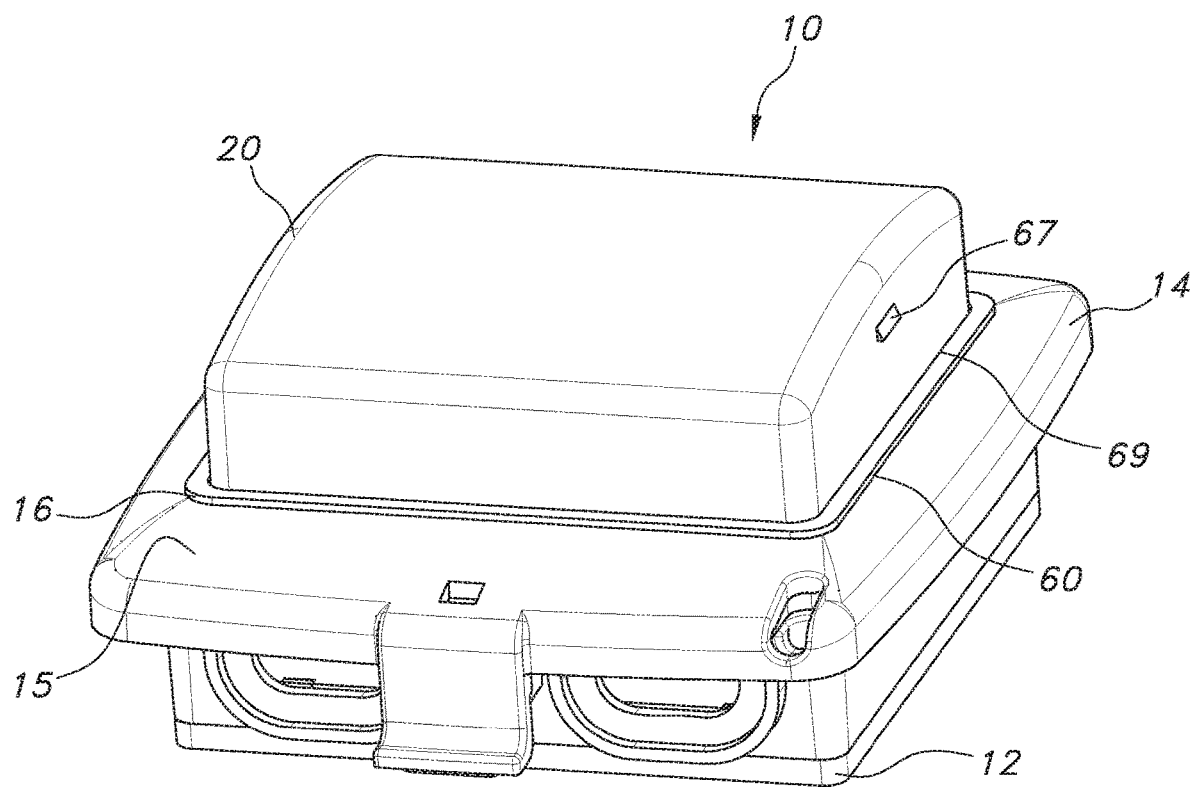
FIG. 1 is a perspective view of the electrical box cover shown in the closed and expanded position.
Figure 2:
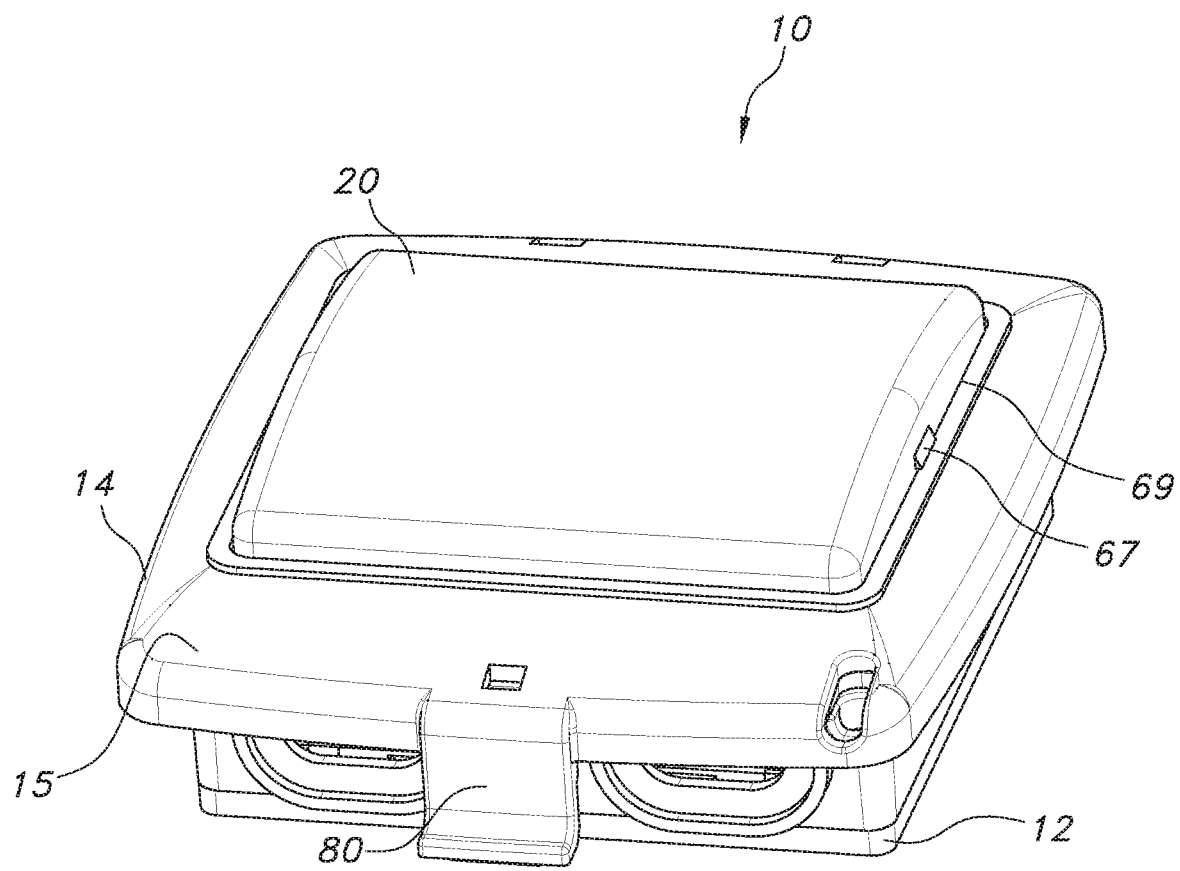
FIG. 2 is a perspective view of the electrical box cover shown in the closed retracted position.
Figure 3A:
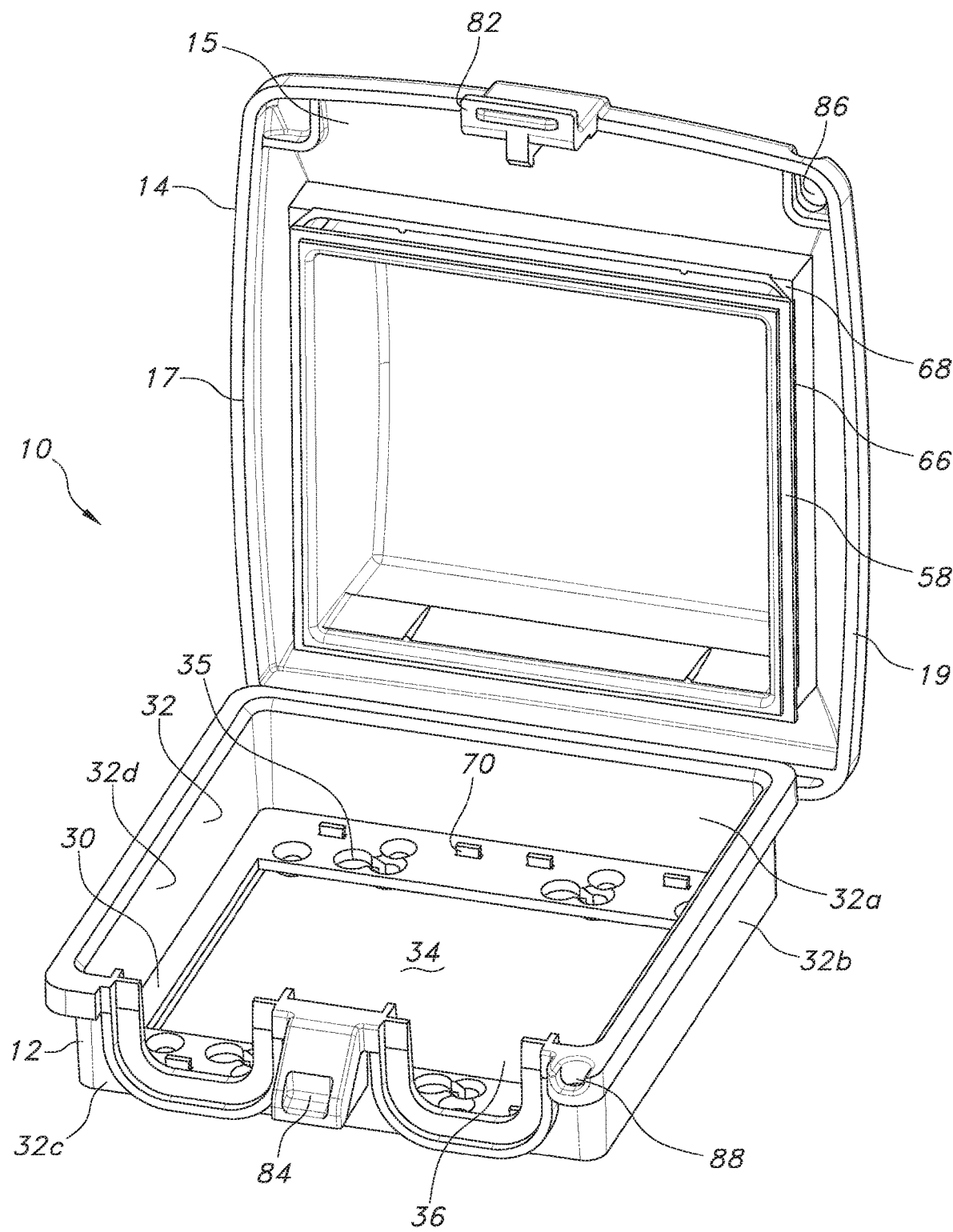
FIGS. 3A and 3B are perspective views of the electrical box cover shown in the open position.
Figure 3B:
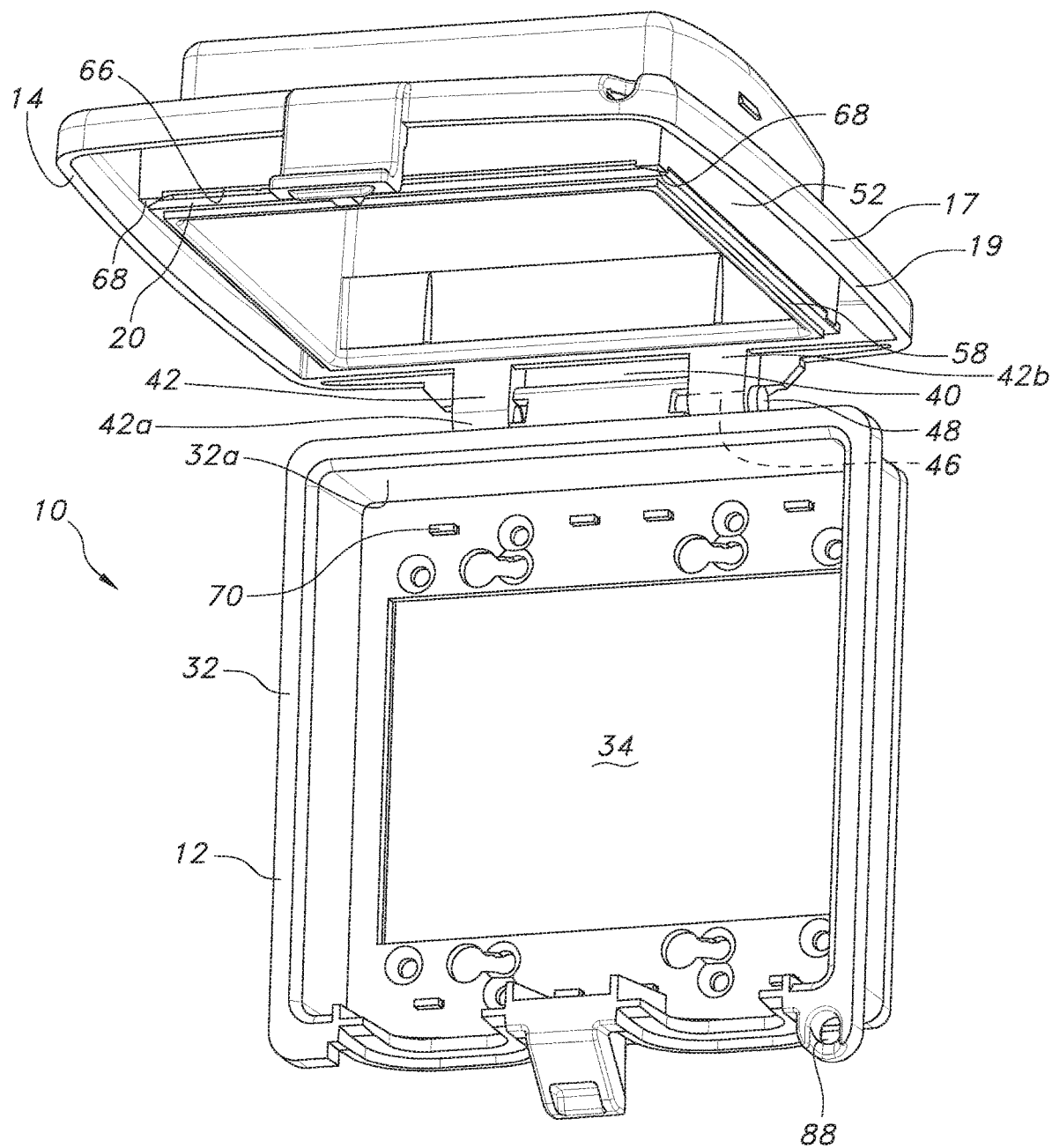
Figure 4:
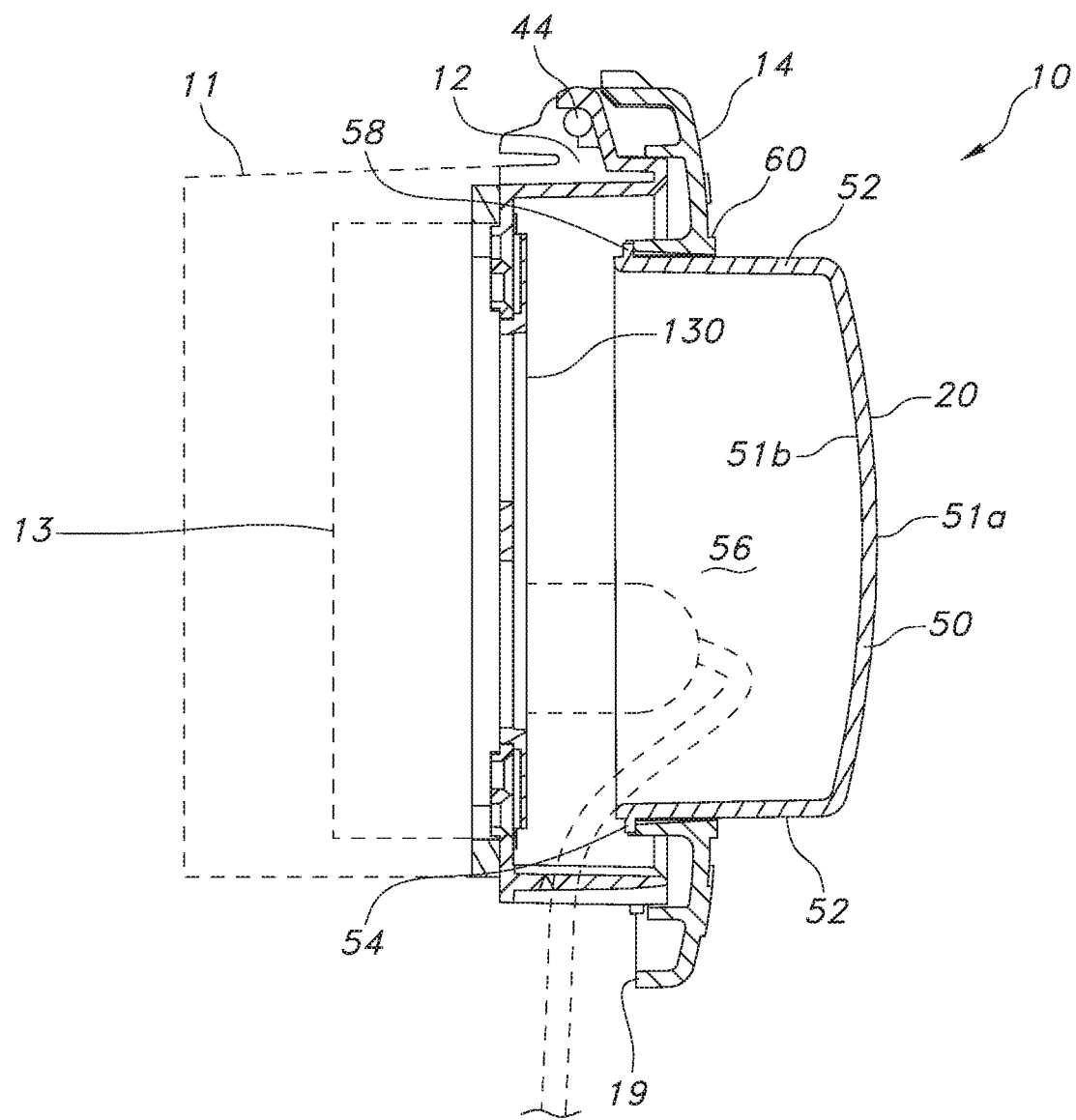
FIG. 4 is a cross-sectional view of the electrical box cover with an adapter plate shown in the expanded position.
Figure 5:
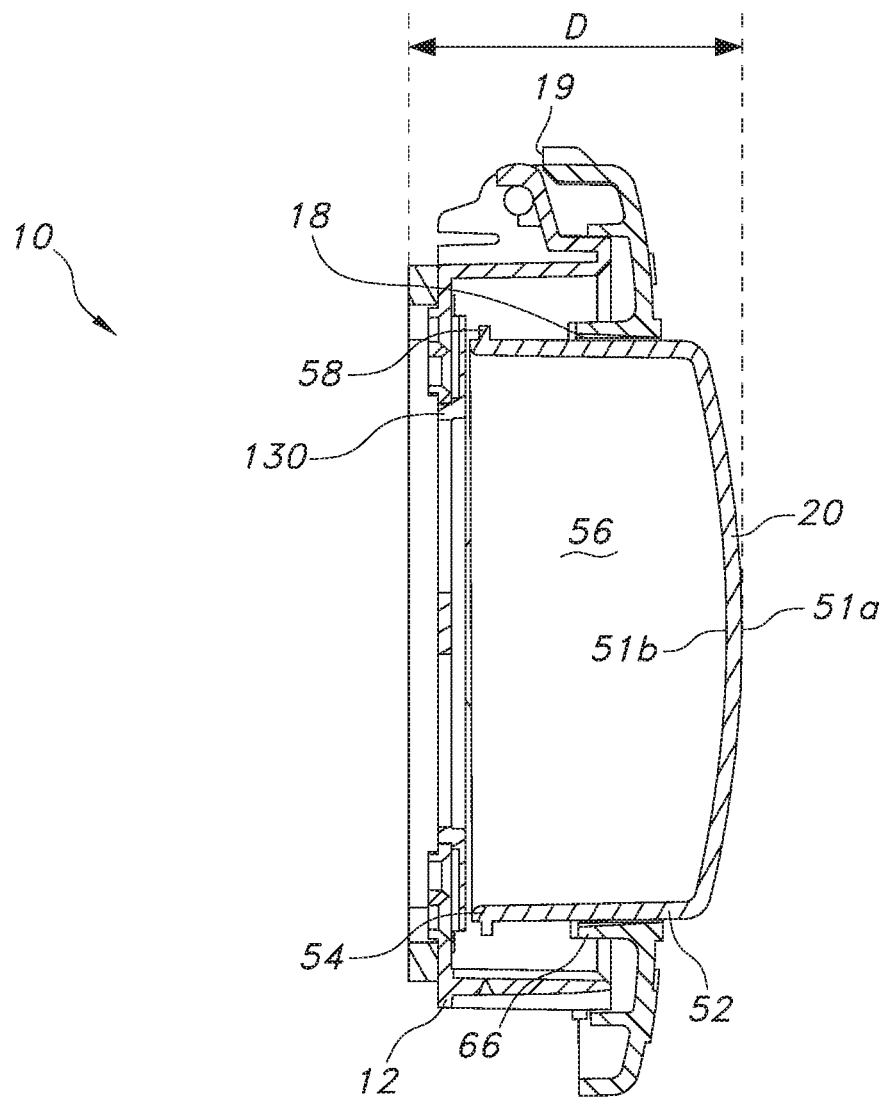
FIG. 5 is a cross-sectional view of the electrical box cover of FIG. 4 shown in the retracted position.
Figure 6:
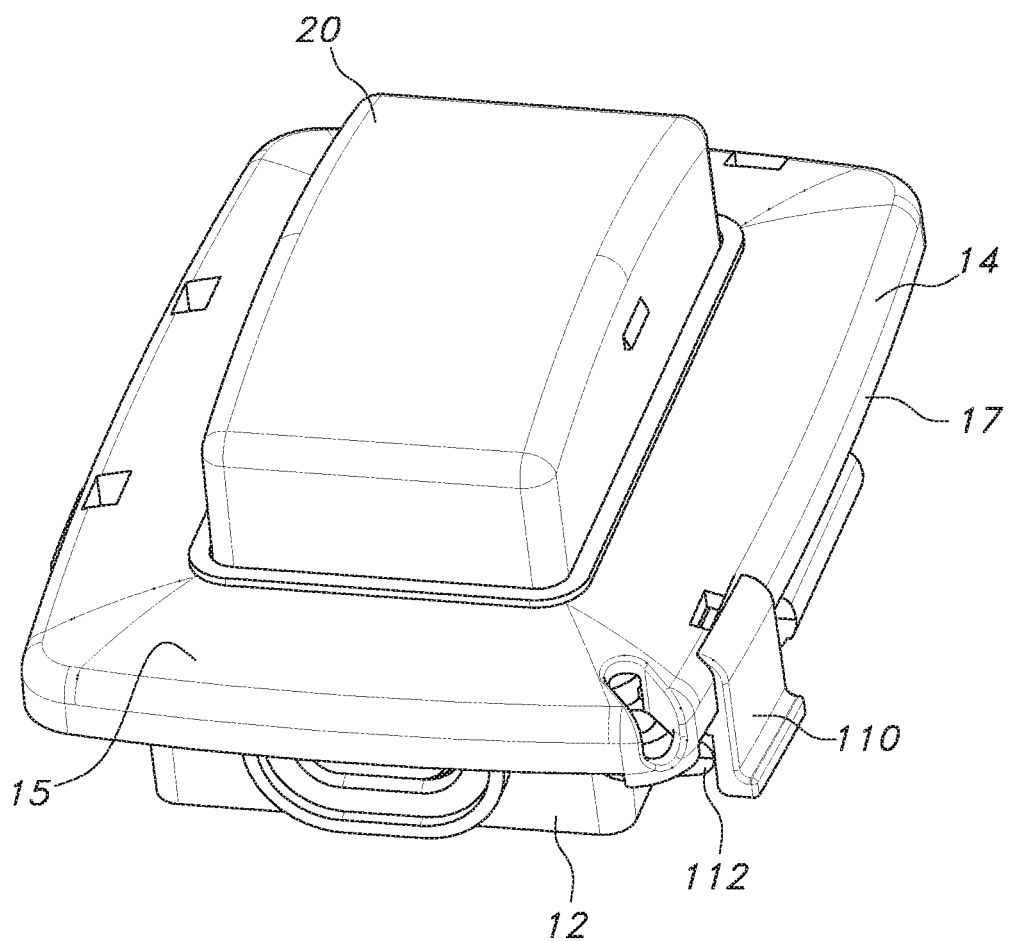
FIG. 6 and FIG. 7 are perspective views showing an alternative embodiment of the electrical box cover showing a housing in an expanded position.
Figure 7:
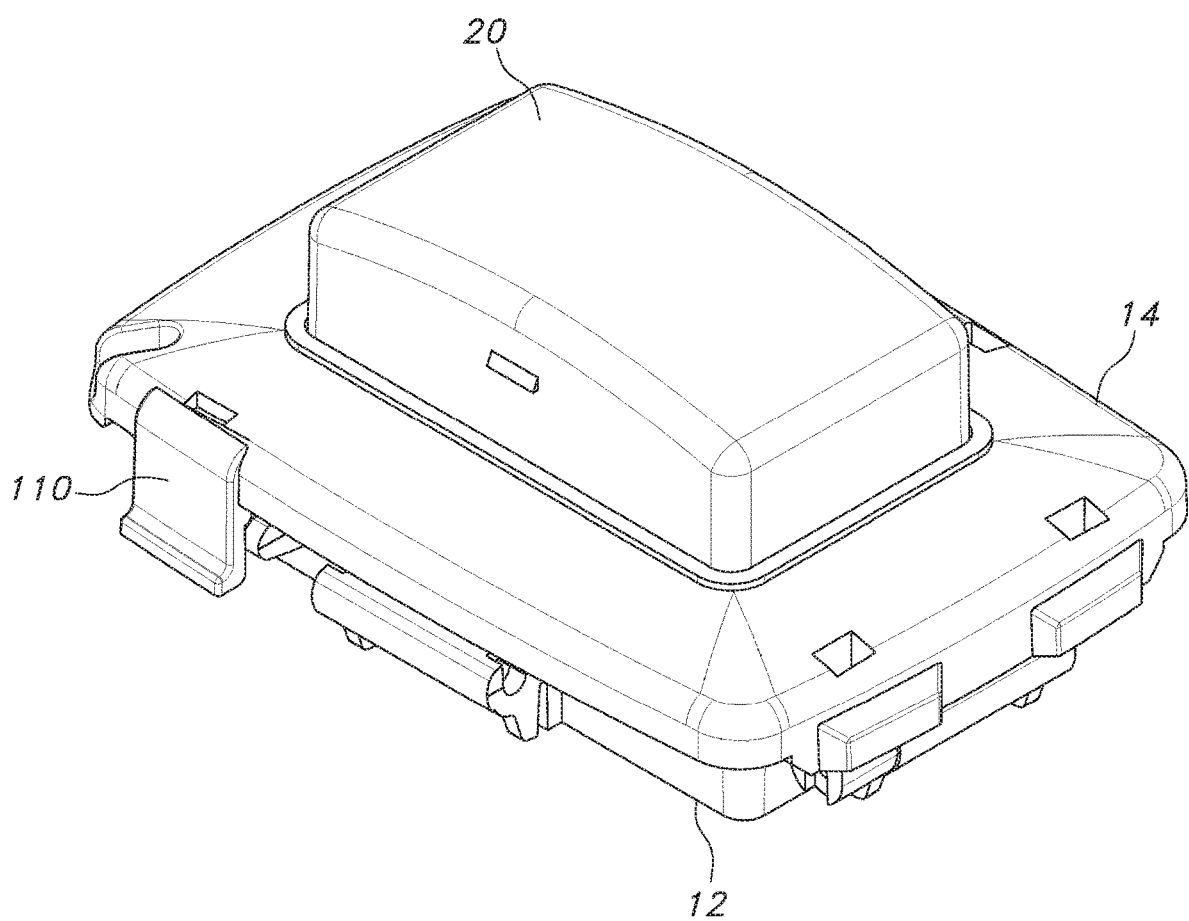

The cover 10 includes a base 12 pivotably connected to a lid 14 by a hinge between an open and closed position. The lid 14 includes a lid plate 15 with an opening 18 defined by a collar 16 for receiving therein a moveable housing 20. The lid plate 15 is bounded at its outer edges by an extension 17 projecting generally orthogonally from the lid plate 15. The extension 17 has an end surface 19. The collar 16 in the lid plate 15 defines an opening 18 that receives the moveable housing 20. The housing 20 is translatable between an extended position, as shown in FIGS. 1 and 4, and a retracted position, as shown in FIGS. 2 and 5. Accordingly, the overall depth D of the cover 10 may be adjusted. The cover 10 can accommodate a corded plug 15 connected to an electrical device 13 when the lid 14 is in the closed position. When the lid 14 is closed, the housing 20 may be moved outwardly to the extended position to provide space for the plug and cord. The expanded position gives the cover 10 sufficient depth D in order to accommodate one or more electrical outlet plugs therein. Accordingly, the electrical device 13 is protected from the elements even when the lid is closed and a cord is plugged into the electrical device 13. When the electrical device 13 is not being used, the housing 20 can be moved to the retracted position, thereby reducing the depth D of the cover 10. The base 12, the lid 14, and the housing 20 may be formed of a plastic material, such as a type known in the art for the fabrication of enclosures used to house electrical devices.

Figure 8:
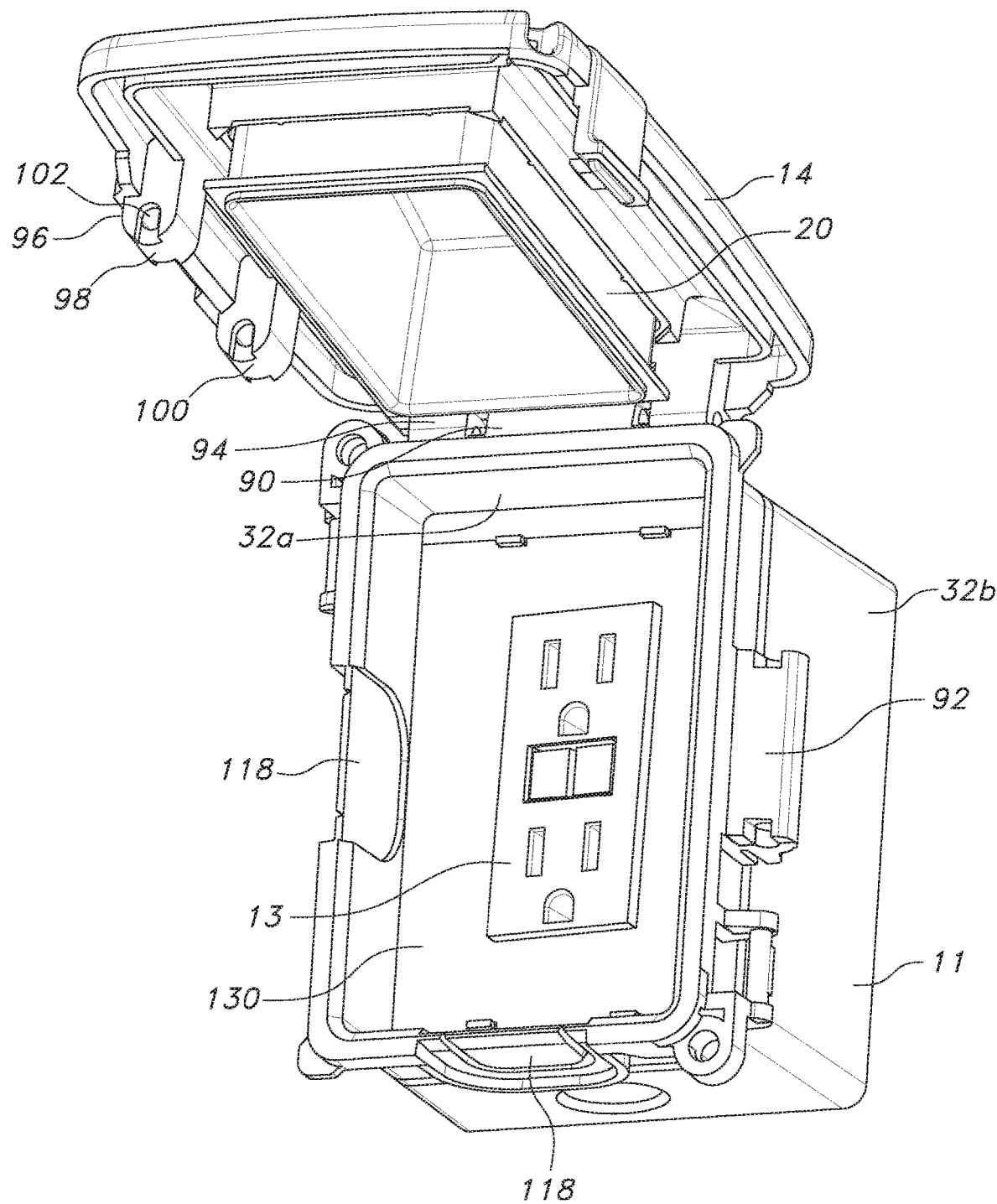
FIG. 8 is a perspective view of the electrical box cover shown in the retracted and open position with the cover attached to an electrical box housing an electrical device.

As shown in FIGS. 4 and 8, the base 12 may be secured by fasteners to an electrical box 11 and/or an electrical device 13 such as outlets or switches secured in the box 11. The base 12 may include a back wall 30 perimetrically bounded by an outwardly extending side wall 32. The side wall 32 may be formed of a plurality of side wall segments 32a-d joined together at their ends to form a continuous side wall 32. The side wall 32 has an upper end with an outwardly extending rim 33. The back wall 30 may include a plurality of openings 35 for securing the cover to an electrical box 11. The back wall 30 may also include a central opening 34 for receiving the face of the electrical device 13. This central opening 34 may be sized to receive a number of electrical devices that have different configurations. One of the side wall segments 32a-d may include one or more notches 36 for receiving a plug cord 38. The notches 36 may be formed by removing a knockout cover in a manner known in the art.

At least one of the base side wall segments 32a-d may include a base hinge member 40 for pivotably connecting the lid 14 to the base 12. The lid 14 may include a lid hinge element 42 along one edge thereof for hingedly connecting with the base hinge member 40. The base hinge member 40 may be a single post having a through hole 44 extending there through. The lid hinge element 42 may include a pair of spaced projections 42a and 42b having a through hole 46 with the space therebetween accommodating the base hinge member 40. It is also contemplated that the base 12 may have two spaced projections and the lid 14 have a single hinge element. The base hinge member 40 may be connected to the lid hinge element 42 by way of a hinge pin 48 inserted in through holes 44 and 46, or other mechanisms that are known in the art.

The housing 20 may include a front wall 50 having an outer 51a and inner surface 51b bounded at its perimeter by a plurality of continuous walls 52. The walls 52 extend outwardly from the front wall 50 and terminate in a distal edge 54. The front wall 50 and side walls 52 form a housing interior 56. The distal edge 54 defines an opening into the interior 56. A flange 58 extends outwardly from the edge 54 and parallel to the front wall 50. The flange 58 may extend completely around the perimeter of the continuous side walls 52. The depth dimension D of the cover 10 extends between the base back wall 30 to the housing front wall outer surface 51*a*. The depth D of the cover 10 is adjustable upon movement of the housing 20 between the retracted and extended position. When the electrical device 13 is not in use, i.e., there is no cord plugged into it, the housing 20 may moved into the retracted position; thereby decreasing the depth D of the cover 10 as shown in FIG. 5.

The opening 18 in the lid 14 may be defined by a collar 16, which extends outwardly from both the inner 62 and outer surfaces 64 of the lid plate 15. The collar 16 helps guide the movement of the housing 20 between the extended and retracted position and can have a wall 60 that extends beyond the interior and exterior surfaces of the lid plate 15. The portion of the wall 60 of the collar 16 which extends from the inner face of the frame 16 has a lower end 66. A plurality of posts 68 project outwardly from the lower end 66 of the collar 16 and form raised abutments, which engage the housing flange 58. This engagement limits the travel of the housing 20 in the extended direction and prevents it from being separated inadvertently from the frame 16. The collar end 66 and posts 68 also prevent the flange 58 and housing end 54 from traveling up into the lid 14. As shown in FIG. 4, the flange 58 and housing end 54 extend below the lid end 19 when the housing is in the fully extended position. Travel of the housing end 54 and flange 58 is limited to travel within the base 12 when the housing 20 is moved between the extended and retracted position. See FIGS. 4 and 5. In addition, the housing 20 may include on outer side walls one or more tabs 67 (FIGS. 1 and 2) extending therefrom. The tabs 67 engage with the collar upper end 69 in order to limit the travel in the retracted direction and to prevent the housing 20 from being removed from the frame 16, when the lid 14 is in the open position.

The base back wall 30 may include a plurality of upwardly extending lugs 70 which engage and secure an adapter plate 130 (described below). The adapter plate 130 permits the cover to be used with electrical devices having different configurations. The adapter plate 130 may include a set of adapter plates each having different openings to accommodate different electrical devices. When the housing 20 is in the fully retracted position as shown in FIG. 5, the housing edge 54 engages the adapter plate. This helps to keep dirt and water from contaminating the electrical device 13.

The lid 14 may further include a latch 80 including a resilient member 82 extending from an edge of the lid 14. The latch 80 engages a catch 84 secured to the base 12. The engagement between the latch 80 and catch 84 secures the lid 14 in the closed position. The lid 14 may be unsecured by lifting the resilient member 82 away from the catch 84 to permit the lid 14 to be opened. The lid 14 may include a through hole 86 in a corner thereof. The latch 80 may include a hole 88 formed on a tab extending from a top end of the side wall 32. When the lid 14 is in the closed position as shown in FIG. 2, the holes 86 and 88 align thereby allowing a locking element such as the hasp of a lock (not shown) to pass there through. Thus, the lid 14 can be securely retained in the closed position and unwanted access to the electrical device 13 within can be prevented.

In the embodiment shown in FIGS. 1-5, the cover 10 may be in the form of a two gang cover. Such a cover 10 can accommodate a double gang outlet box having two electrical devices. Alternatively, the cover 10' may be a single gang cover as shown in FIGS. 6 to 12.

In the single gang embodiment, the base 12, lid 14 and housing 20 are similar to that as described in the double gang embodiment set forth above and are represented by the same reference numbers. The base back wall 30 may be sized to accommodate a single electrical device 13. In addition, the single gang cover 10' may be adapted to accommodate both a vertical and horizontal orientation of the electrical box to which it is attached. To achieve this, the lid 14 may be selectively secured to either of two adjacent base side wall segments. Therefore, in either orientation, the cover hinge will be at the top of the cover 10 and the lid 14 is rotated downwardly to move it to the closed position.

Figure 9:
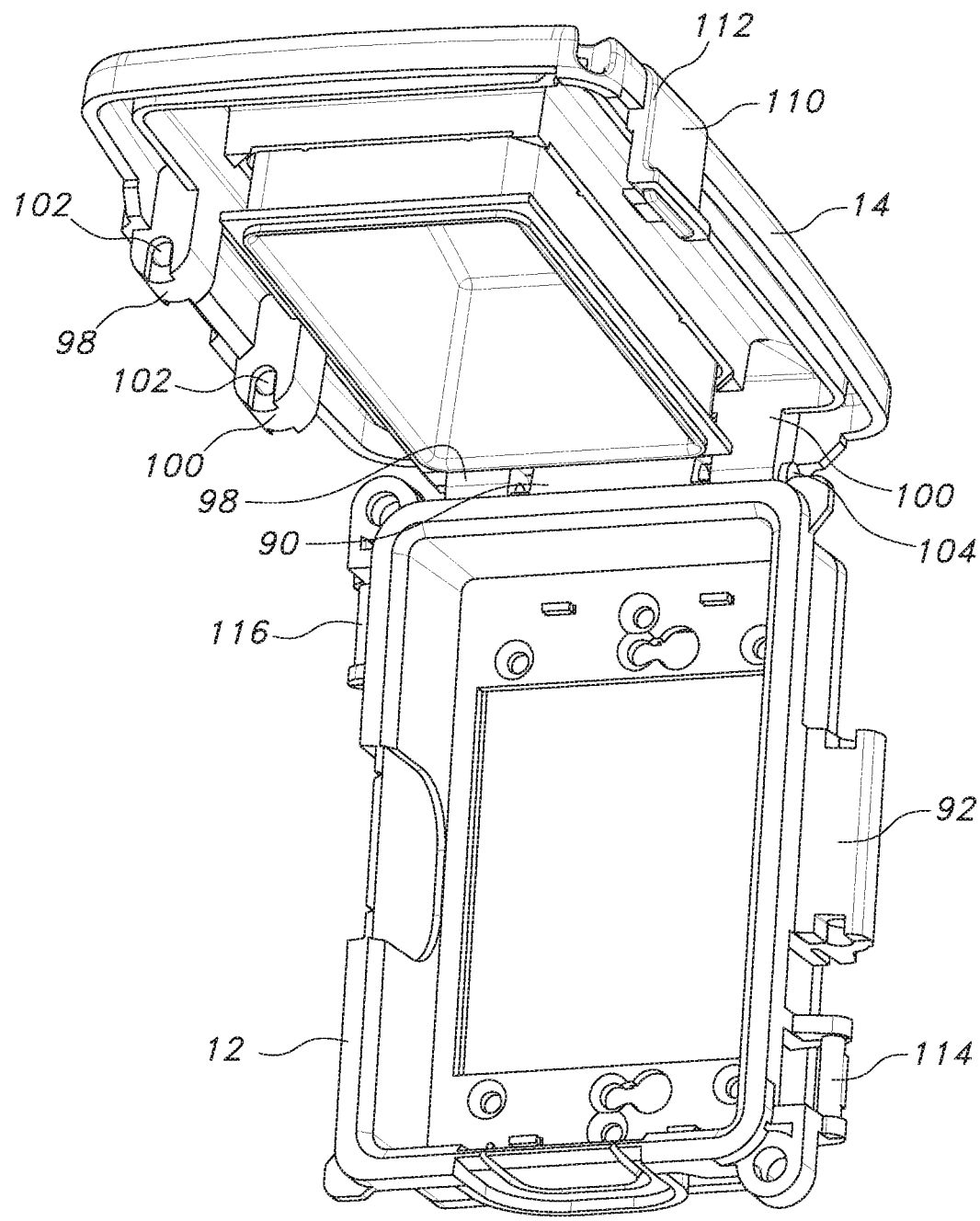
FIG. 9 is a perspective view of the electrical box cover shown in the open position.
Figure 10:
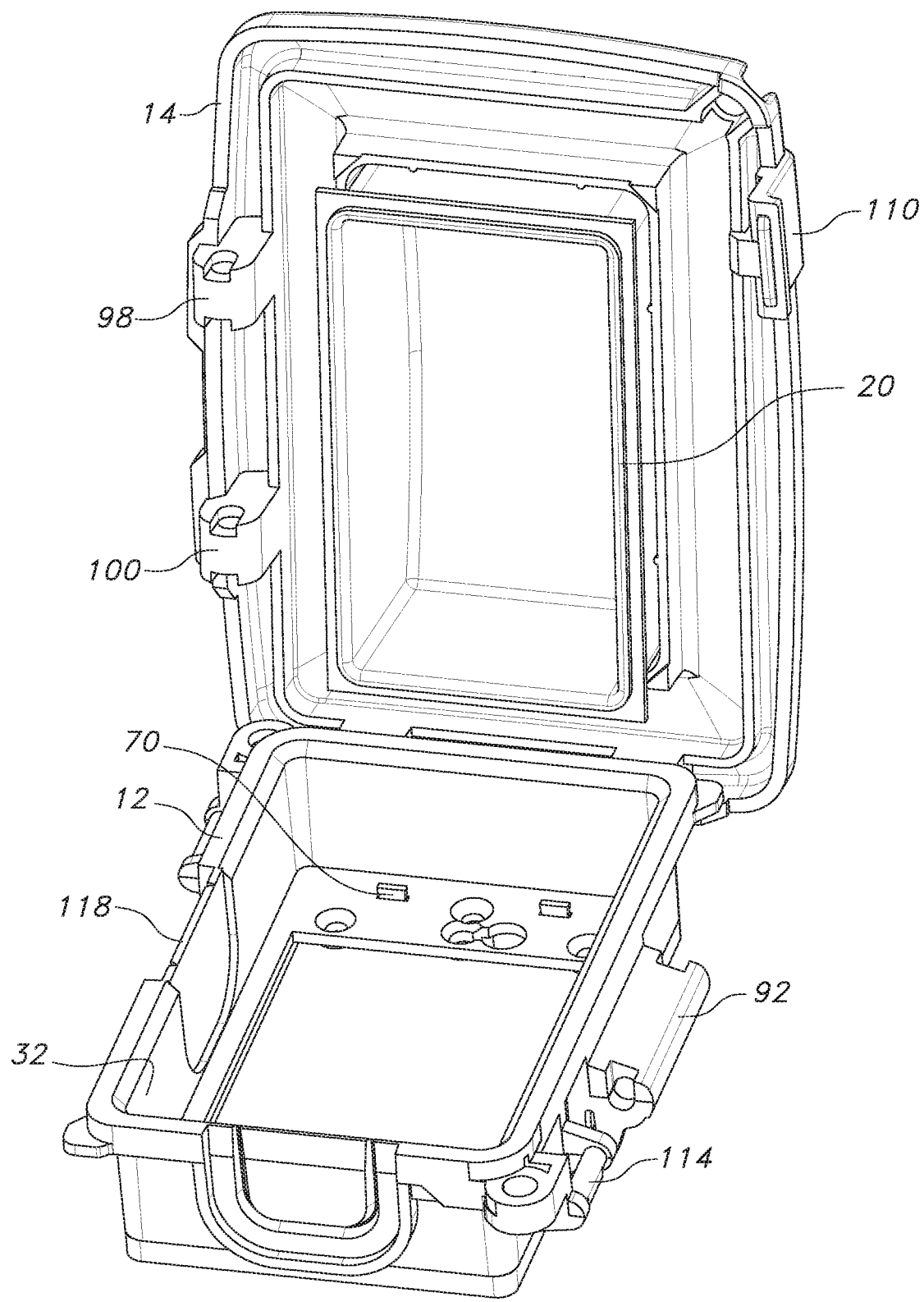
FIG. 10 is a perspective view of the electrical box cover shown in the open position and the vertical orientation.
Figure 11:
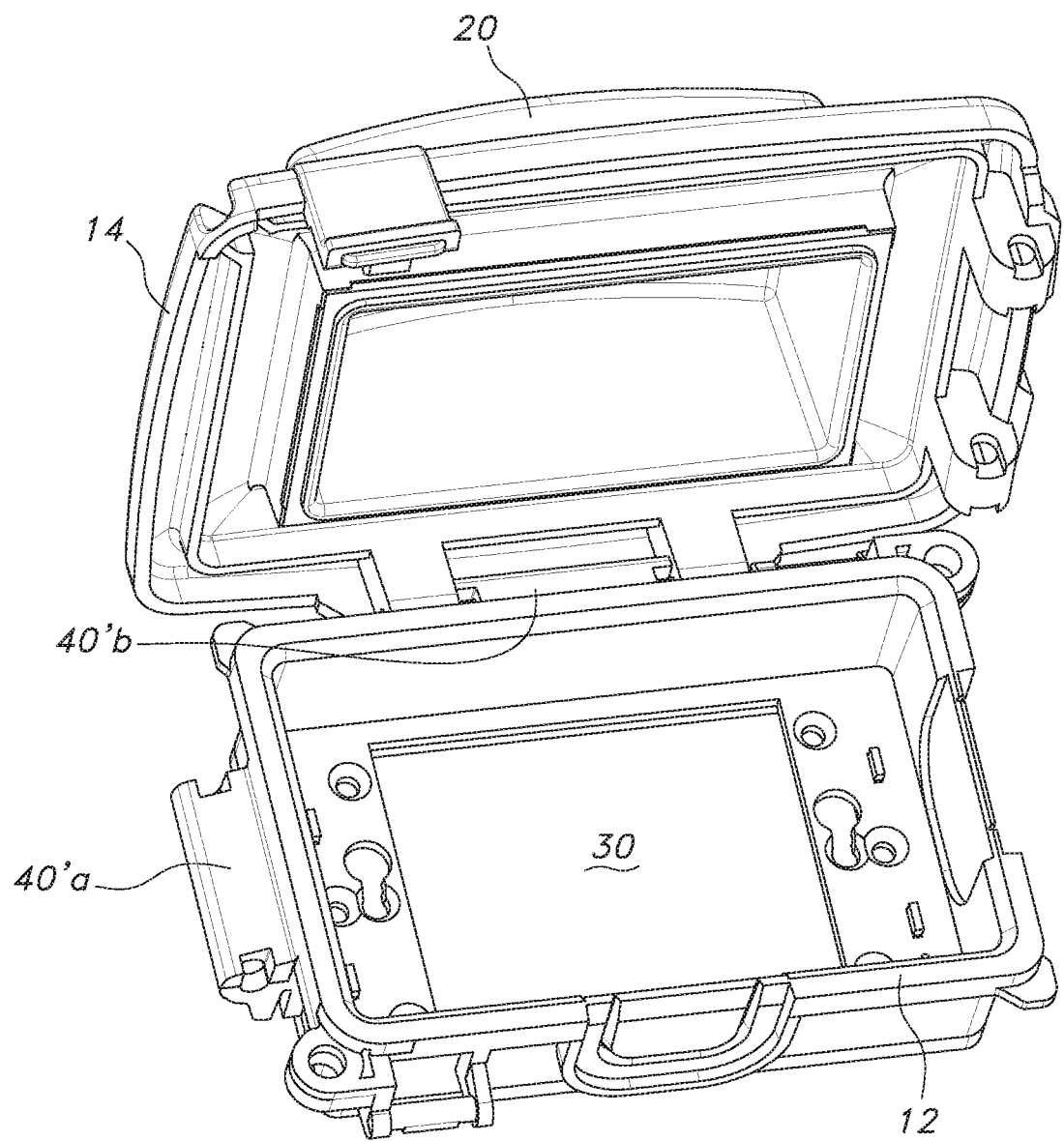
FIG. 11 is a perspective view of the electrical box cover shown in the open position and the horizontal orientation.
Figure 12:
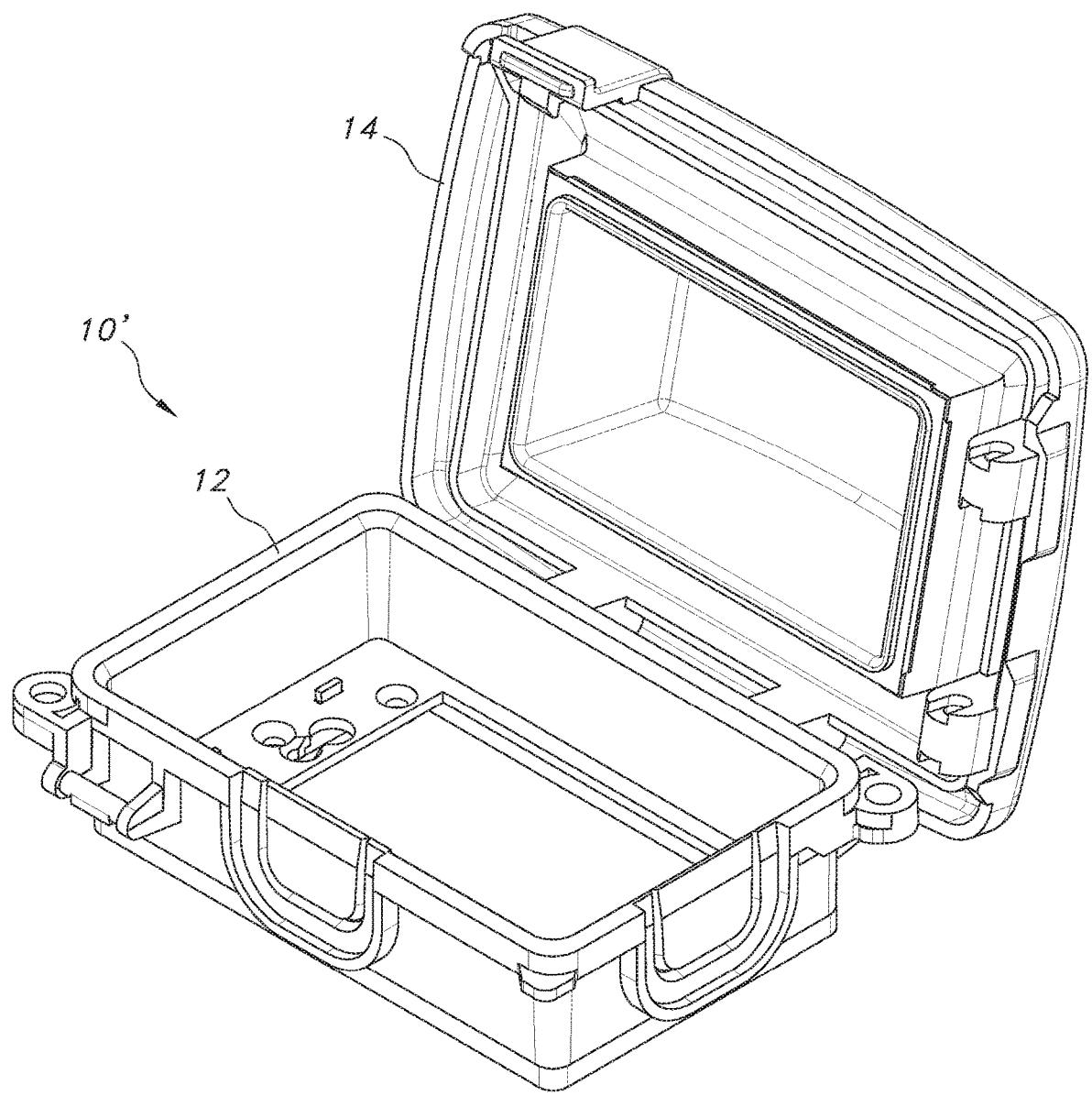
FIG. 12 is a perspective view of the electrical box cover shown in the open position and the horizontal orientation.
Figure 13A:
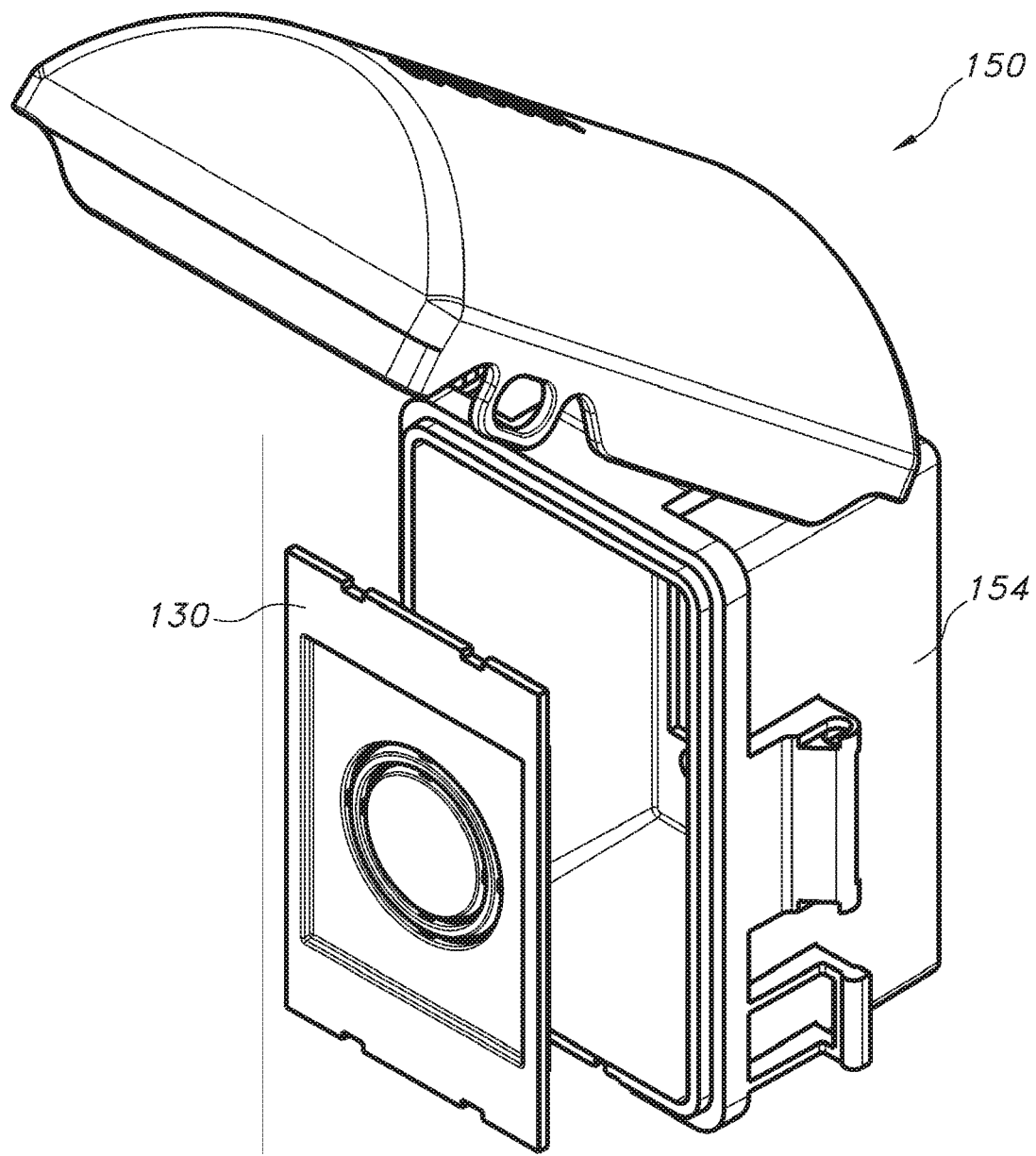
Figure 13B:
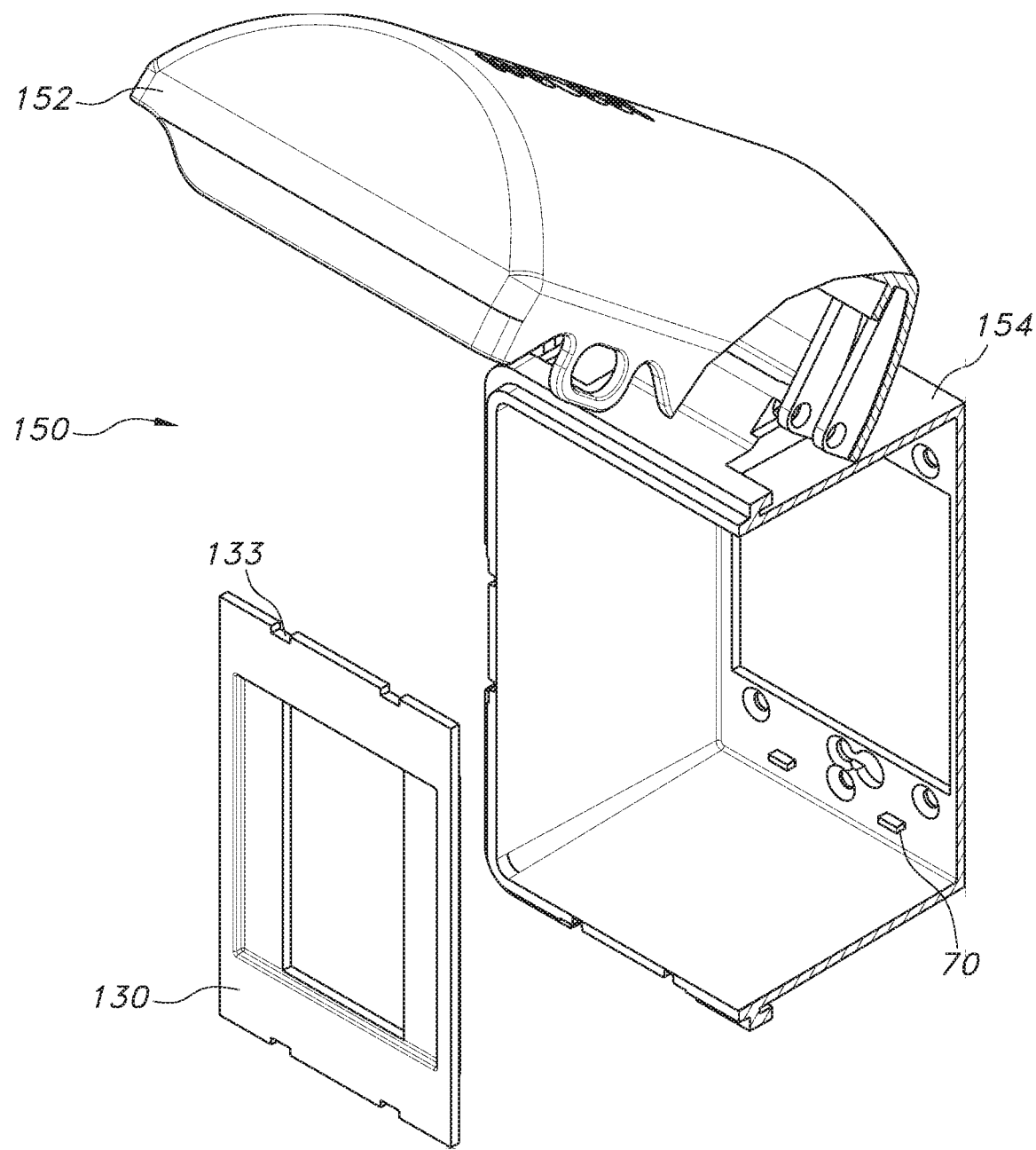
FIG. 13B is a cross-sectional perspective view of the base and lid.
Figure 14:
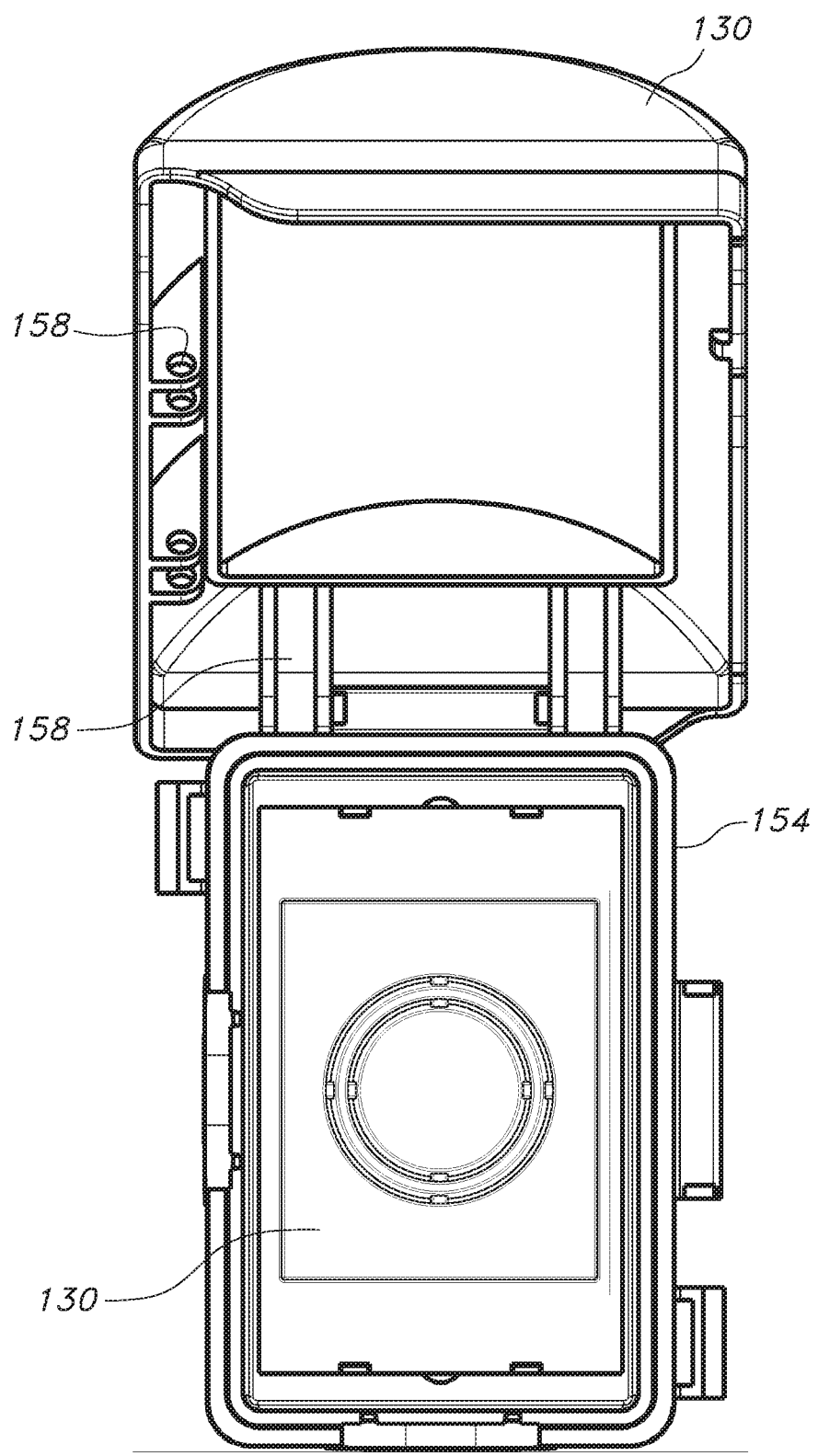
Figure 15:
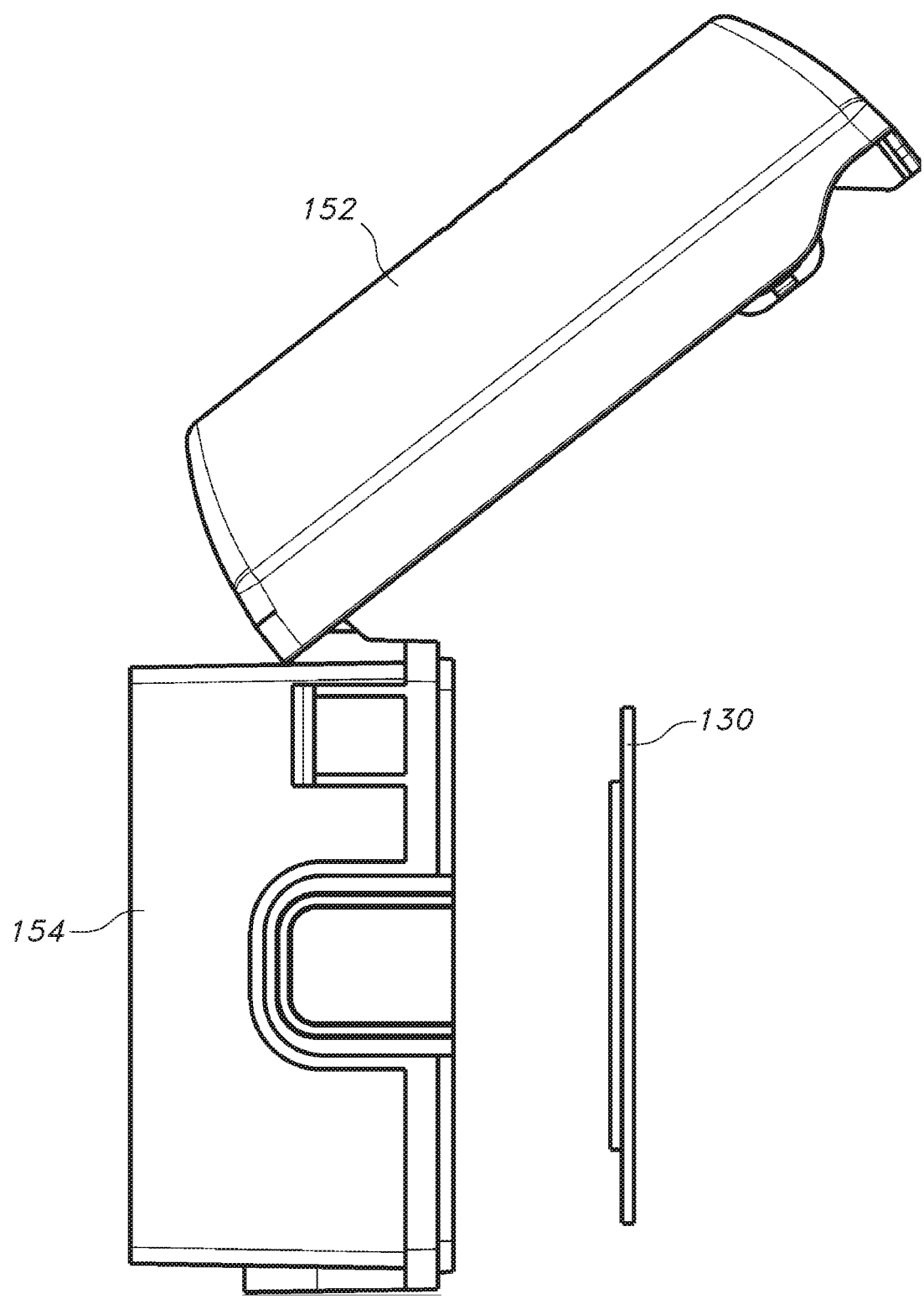
Figure 16:
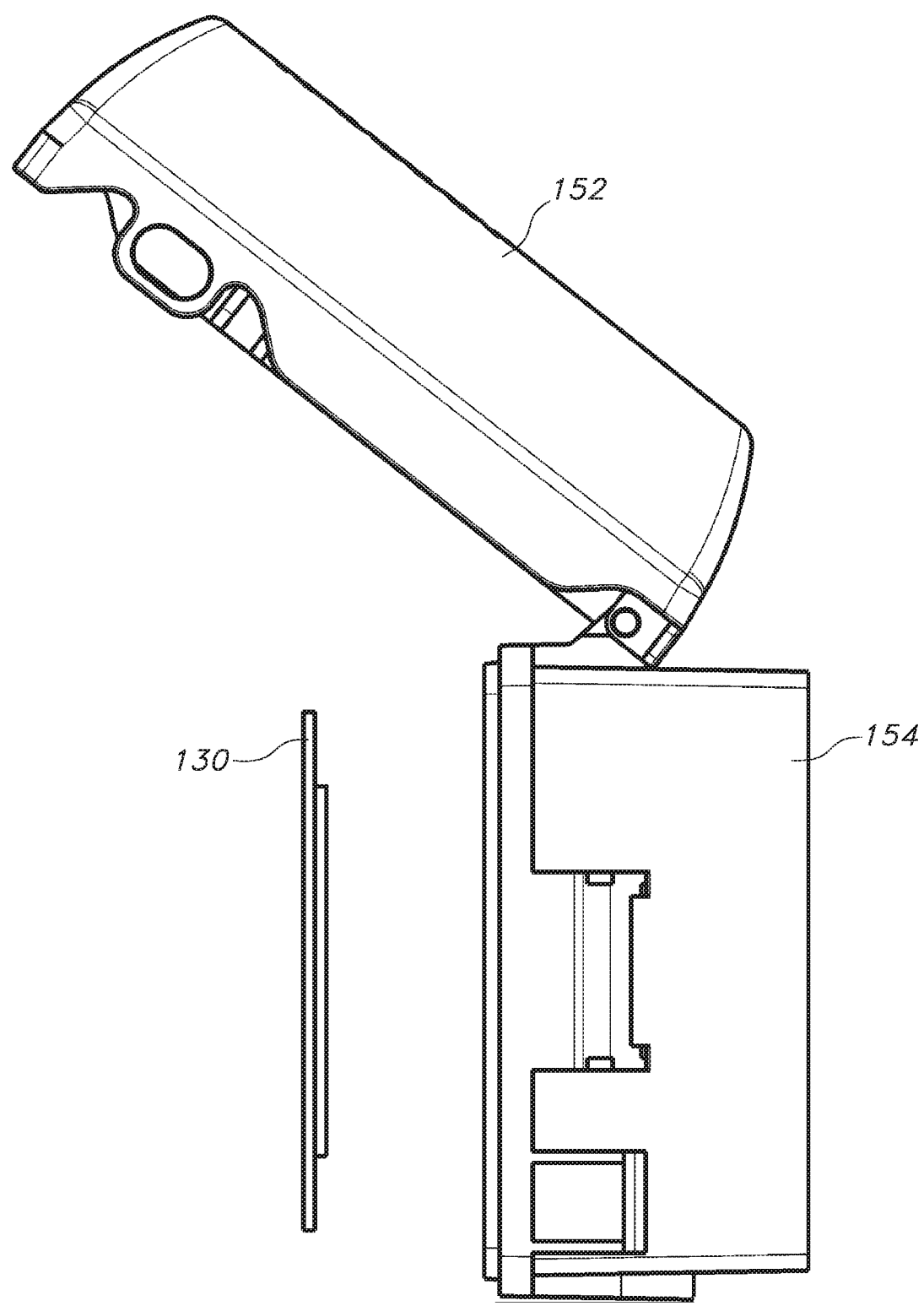
Figure 17:
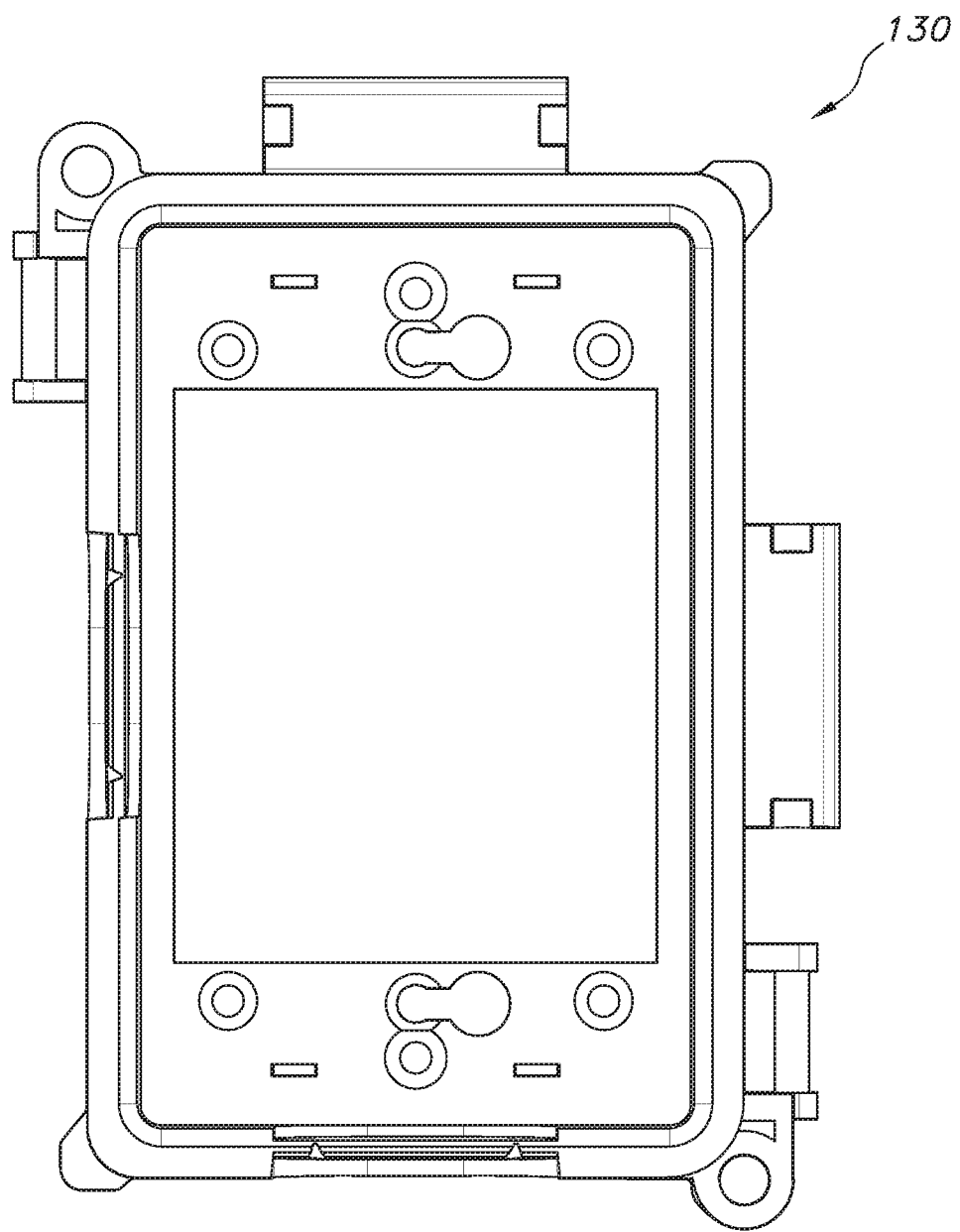

With reference to FIGS. 8-10, the cover 10' is shown in the vertical orientation wherein the lid 14 is secured to one end of the base 12. The base 12 may include first and second base hinge members 90 and 92 formed on side wall segments 32*a* and 32*b* adjacent to each other. In addition, the lid 14 may also include first and second lid hinge elements 94 and 96 secured to and extending from adjacent sides of the lid 14. A hinge pin 104 may be used in order to secure the lid 14 to the base 12 in the desired orientation.

Each of the first and second lid hinge elements 94 and 96 may include two posts 98 and 100 extending therefrom having a through hole 102 extending therein. The through hole 102 can accommodate a pin 104. The complementary base hinge member 94, 96 may include a single protrusion having a through hole extending along its length. It is within the contemplation of the present disclosure that the hinge elements 94, 96 could have different configurations in order to pivotally connect the lid 14 to the base 12.

The lid 14 may include a latch 110 including a resilient member 112 extending from a sidewall of the frame 16. The base may include first and second catch members 114 and 116 extending secured to adjacent side wall segments 32*a* and 32*b*. When the lid 14 is hingedly secured to the base 12 in the vertical orientation, the latch 110 may engage with the first catch 114 when the lid is moved to the closed position. When the lid 14 is attached to the base 12 in the horizontal orientation, the latch 110 may engage the second catch member 116. Adjacent the catch members 114, 116 are tabs having through holes which line up with a through hole in the corner of the lid 14. Accordingly, the lid 14 can be secured in the closed position with a locking device when it is either in the horizontal or vertical orientation. Two adjacent side walls of the base 12 may include knockouts 118 which may be removed in order to allow a cord to pass there through.

Figure 25:
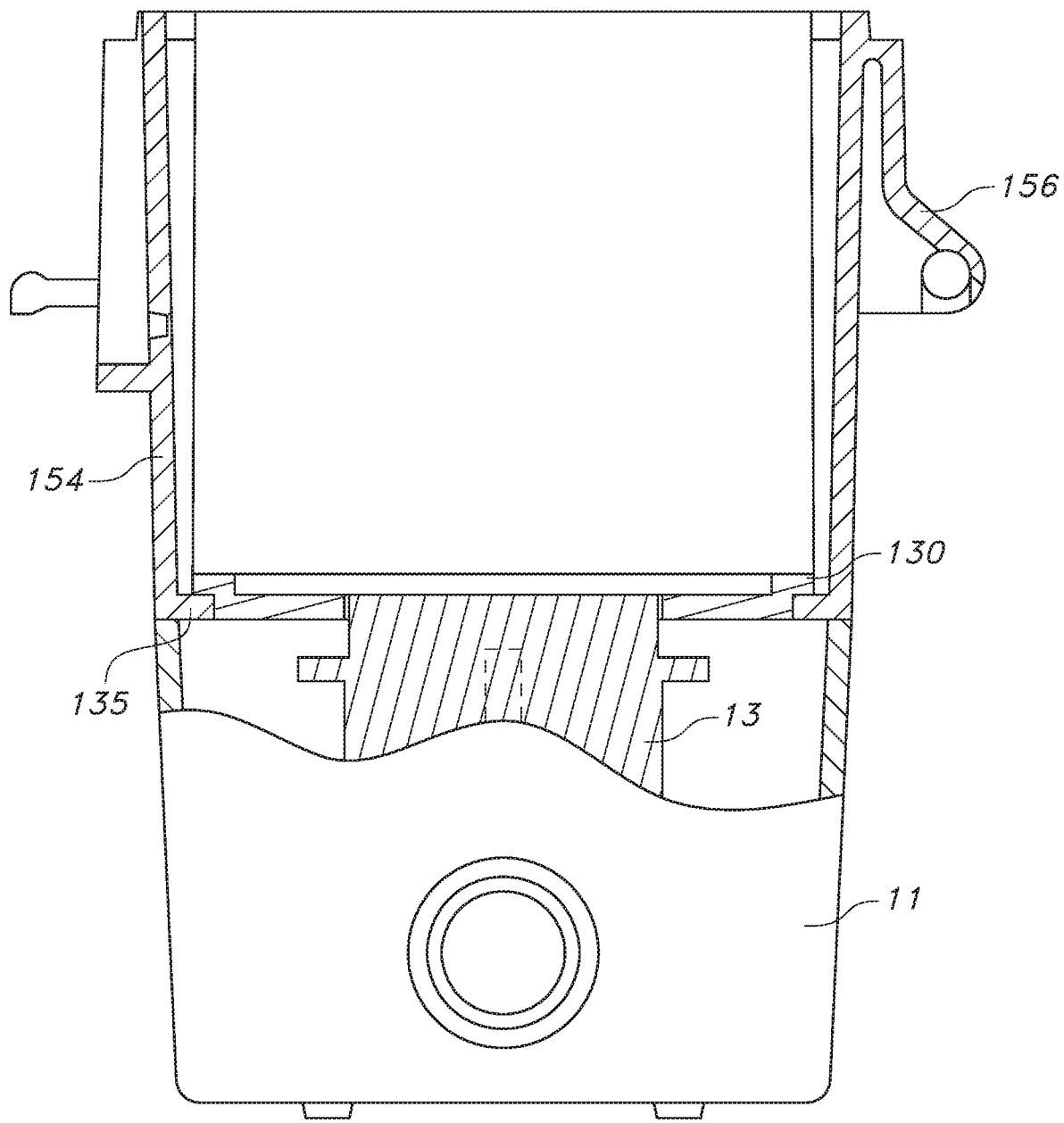
FIG. 25 is a partial sectional view of the cover of FIG. 24.

As set forth above, the adapter plate 130 may cover the central opening 34 in the back wall 30 in order to create an electrical device opening 132. The electrical device opening 132 may have a specific configuration for a particular electrical device. The adapter plate 130 may include a plurality of notches 133 along a top and bottom edge in order to receive the lugs 70 extending from a back wall 135. The interaction between the lugs 70 and notches 133 may be an interference fit and/or a snap fit to removably retain the plate 130 in the base 12. The adapter plate 130 may include a back surface 134 having an extension 136 that projects outwardly. The extension 136 is configured to conform closely with the edges of the back wall opening as shown in FIG. 25. The extension 134 helps to center the adapter plate 130 with respect to the back wall 30.

The adapter plate 130 may be used on other type of electrical box covers including those that are not expandable. With reference to FIGS. 13 to 25, the cover 150 may include a lid 152 pivotally secured to a base 154. The base 154 may include two base hinge members 156 with one on two adjacent walls. The lid 152 may include two lid hinge elements 158 with one located on adjacent lid side walls. This permits the lid 152 to be mounted to the base 154 to accommodate both horizontal and vertical installations.

Figure 18:
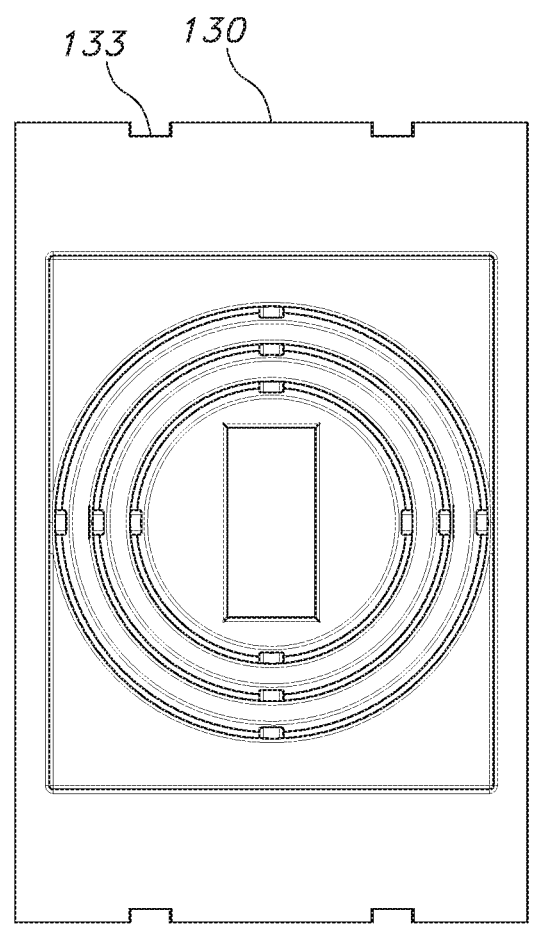
FIGS. 18-19 are various views of the adapter plate.
Figure 18:
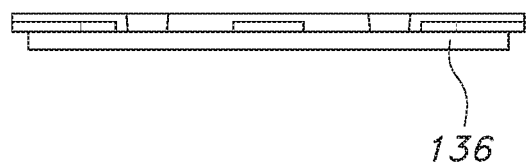
Figure 19:
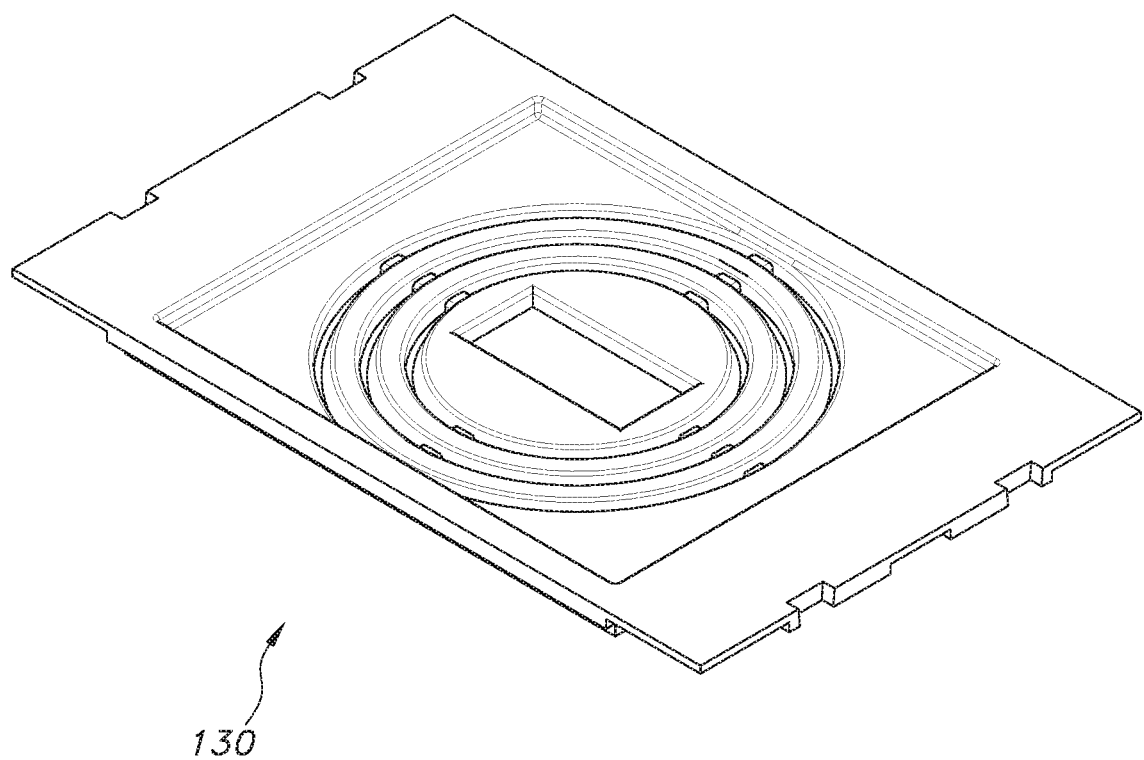
Figure 20:
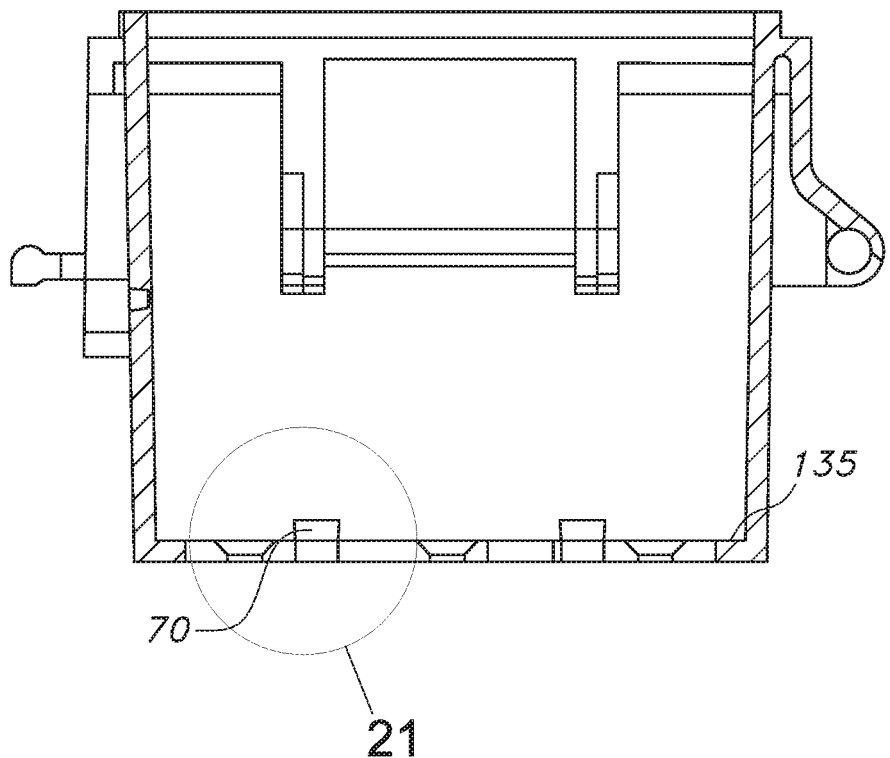
FIGS. 20 and 21 are detail views of the electrical box cover.
Figure 21:
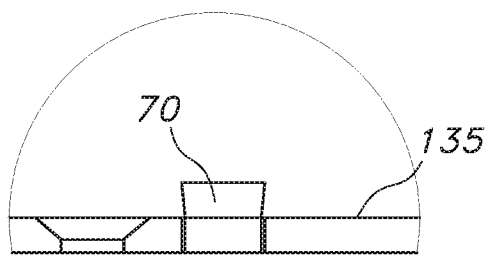
Figure 22:
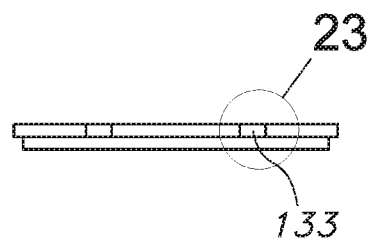
FIGS. 22 and 23 detail views of the adapter plate.
Figure 23:
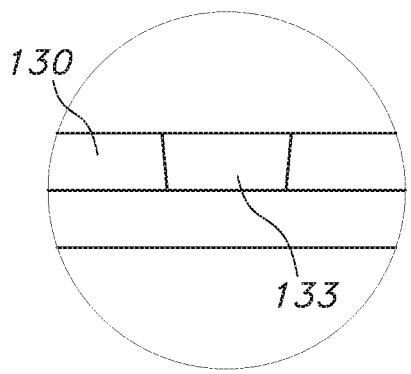
Figure 24:
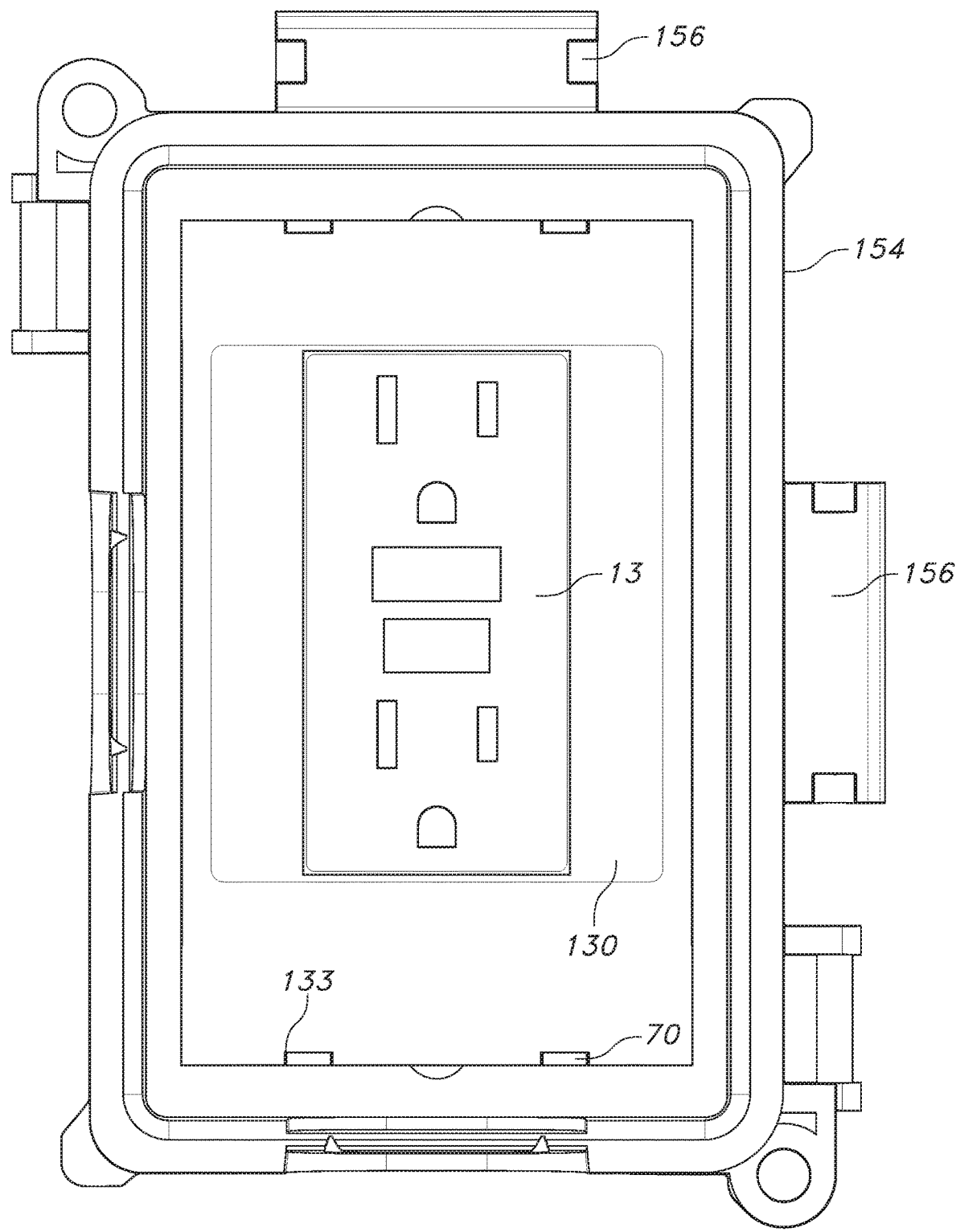
FIG. 24 is a plan view of a cover with an adapter plate and electrical device.

As shown in FIG. 25, when the adapter plate 130 is installed in the base 154, the face of the mounting plate is flush with the face of the electrical device 13. The extension does not extend beyond the base back wall. The adapter plate 130 may also include one or more knockouts in order to adapt the electrical device opening 132 to a particular electrical device as shown in FIGS. 18 and 19.

In general, the foregoing description is provided for exemplary and illustrative purposes; the present invention is not necessarily limited thereto. Rather, those skilled in the art will appreciate that additional modifications, as well as adaptations for particular circumstances, will fall within the scope of the invention as herein shown and described and of the claims appended hereto.

We claim:

1. An electrical box cover, the cover comprising:
   a base comprising a back wall perimetrically bounded by an upwardly extending continuous side wall formed from a plurality of side wall segments, the back wall having an opening for receiving an electrical device;
   a lid comprising a front plate with an opening defined by a collar, the lid having an exterior side and an interior side and pivotably connected to the base; and
   a housing including a front wall, an outwardly extending tab, and a perimetrical side wall, the perimetrical sidewall extending from the front wall to a distal edge to define a housing interior and an exterior, wherein a flange offset from both the distal edge and the tab extends from the perimetrical side wall on the exterior of the housing,
   wherein the housing being slidably inserted in the collar from the interior side of the lid and moveable between a retracted position and an extended position with respect to the collar, wherein the tab is structured and positioned to be engageable with an outer portion of the collar to limit travel of the housing in a retracted direction, and wherein the collar includes a wall extending from the interior side of the front plate to a lower end of the wall, the wall including a plurality of posts that project outwardly from the lower end that engage the flange of the housing with the housing in the extended position.

2. The cover as defined in claim 1, wherein a plurality of lugs extend into the interior of the base from the back wall.

3. The cover as defined in claim 1, wherein the base has first and second hinge members secured to adjacent side wall segments.

4. The cover as defined in claim 3, wherein the lid further comprises at least two hinge elements extending from the interior side of the lid plate, wherein two of the at least two hinge elements are selectively engageable with one of the first or second hinge members of the base in order to permit the lid to be pivotally attached to separate locations on the base.

5. The cover as defined in claim 1, wherein the lid includes a latch extending therefrom and the base includes a catch cooperating with the latch to secure the lid in a closed position.

6. The cover as defined in claim 1, wherein the tab is structured and positioned to abut an upper edge of the collar to limit travel of the housing in a retracted direction.

7. The cover as defined in claim 1, wherein the cover has a depth dimension extending between the back wall of the base to the front wall of the housing, the depth being adjustable upon movement of the housing.

8. The cover as defined in claim 1, wherein an adapter plate is disposed on the back wall of the base.

9. The cover as defined in claim 8, wherein the back wall includes a plurality of lugs extending upwardly therefrom, the plurality of lugs engaging the adapter plate, and the housing engages the adapter plate when the housing is in the retracted position.

10. The cover as defined in claim 1, wherein the front plate of the lid is perimetrically bound by a lid extension projecting orthogonally from the front plate, wherein, when at the retracted position, the distal edge and the flange extend in a direction toward the back wall beyond the lid extension.

11. The cover as defined in claim 1, wherein travel of the distal edge of the housing is limited to travel within the base when the lid is in a closed position.

12. An electrical box cover, the cover comprising:
    a base including a back wall perimetrically bounded by an upwardly extending side wall, the back wall having an opening for receiving an electrical device;
    a lid pivotally connected to the base at first and second positions, the lid including a lid plate having an opening, the lid plate being perimetrically bounded by a lid extension projecting orthogonally from the lid plate, wherein the opening is defined by a collar extending above and below the lid plate; and
    a housing including a front wall and a plurality of contiguous side walls extending therefrom and defining a housing interior and exterior, the side walls terminating at a distal edge and having a flange offset from the distal edge and extending from the exterior of the side walls, the housing being slidably disposed within the lid opening and moveable between a retracted position and an extended position with respect to the collar, wherein the housing is structured such that, when at the retracted position, the distal edge of the housing extends in a direction toward the back wall beyond the lid extension, and wherein the collar includes a wall extending below the lid plate to a lower end of the wall, the wall including a plurality of posts that project outwardly from the lower end that engage the flange of the housing with the housing in the extended position.

13. The cover as defined in claim 12, wherein a plurality of lugs project inwardly from the back wall of the base.

14. The cover as defined in claim 12, wherein the flange is spaced from an upper edge of the collar by the wall when the housing is in the extended position.

15. The cover as defined in claim 12, wherein the housing include a stop disposed on one of the plurality of contiguous sidewalls to limit travel of the housing toward the retracted position.

16. The cover as defined in claim 12, further including an adapter plate disposed on the base back wall of the base, the adapter plate configured to generally receive a plurality of electrical devices, the adapter plate having an opening specifically configured to receive an electrical device having a particular configuration.

17. An electrical box cover, the cover comprising:
    a base comprising a back wall perimetrically bounded by an upwardly extending continuous side wall formed from a plurality of side wall segments, the back wall having an opening for receiving an electrical device, wherein the base has first and second hinge members secured to adjacent side wall segments, and wherein the base includes a catch and an adapter plate is disposed on the back wall of the base;

a lid comprising a front plate with an opening defined by a collar, the lid having an exterior side and an interior side and pivotably connected to the base, wherein the lid further comprises at least two hinge elements extending from the interior side of the lid plate, wherein two of the at least two hinge elements are selectively engageable with one of the first or second hinge members of the base in order to permit the lid to be pivotably attached to separate locations on the base, wherein the lid includes a latch extending therefrom, a latch cooperating with the catch to secure the lid to the base in a closed position;

and wherein the front plate is perimetrically bound by an extension projecting orthogonally from the front plate; and a housing including a front wall and a perimetrical side wall extending from the front wall to a distal edge to define a housing interior and an exterior, wherein a flange offset from the distal edge extends from the perimetrical side wall on the exterior of the housing, wherein the housing being slidably inserted in the collar from the interior side of the lid and moveable between a retracted position and an extended position with respect to the collar, wherein the distal edge and the flange extend, when the housing is at the retracted position, beyond the lid extension, wherein the collar includes a wall extending from the interior side of the front plate to a lower end, the wall including a plurality of posts that project outwardly from the lower end that engage the flange of the housing with the housing in the extended position.

18. The cover as defined in claim 16, wherein the distal edge of the housing engages the adapter plate when the housing is at the retracted position.

19. The cover as defined in claim 17, wherein the the distal edge of the housing engages the adapter plate when the housing is at the retracted position.

* * * * *